US011099238B2

(12) United States Patent
Lu et al.

(10) Patent No.: US 11,099,238 B2
(45) Date of Patent: Aug. 24, 2021

(54) DISTRIBUTED CONTROL MODULES WITH BUILT-IN TESTS AND CONTROL-PRESERVING FAULT RESPONSES

(71) Applicant: General Electric Company, Schenectady, NY (US)

(72) Inventors: Manxue Lu, Swampscott, MA (US); R. Sheldon Carpenter, Hamilton, OH (US); John Lawrence DeJager, Milford, OH (US)

(73) Assignee: General Electric Company, Schenectady, NY (US)

( * ) Notice: Subject to any disclaimer, the term of this patent is extended or adjusted under 35 U.S.C. 154(b) by 113 days.

(21) Appl. No.: 16/366,500

(22) Filed: Mar. 27, 2019

(65) Prior Publication Data
US 2020/0309852 A1    Oct. 1, 2020

(51) Int. Cl.
*G01R 31/08*     (2020.01)
*G01R 31/3187*   (2006.01)
*G01R 31/28*     (2006.01)

(52) U.S. Cl.
CPC ......... *G01R 31/3187* (2013.01); *G01R 31/08* (2013.01); *G01R 31/2815* (2013.01); *G01R 31/2829* (2013.01)

(58) Field of Classification Search
CPC ................ G01R 31/3187; G01R 31/08; G01R 31/2815; G01R 31/2829
See application file for complete search history.

(56) References Cited

U.S. PATENT DOCUMENTS 3,786,419 A    1/1974  Nick
4,368,520 A    1/1983  Hwang et al.
(Continued)

FOREIGN PATENT DOCUMENTS

EP    1780858 A1    5/2007
EP    2343609 A1    8/2010
(Continued)

OTHER PUBLICATIONS

Miller et al., Modern Line Current Differential Protection Solutions, Protective Relay Engineers 63$^{rd}$ Conference, Mar. 29, 2010-Apr. 1, 2010, pp. 1-25.
(Continued)

*Primary Examiner* — Jermele M Hollington
*Assistant Examiner* — Taqi R Nasir
(74) *Attorney, Agent, or Firm* — Fitch, Even, Tabin & Flannery, LLP

(57) ABSTRACT

A distributed control system having at least a distributed control module is disclosed. The distributed control module may be configured to determine a fault state associated with a control loop using a built-in test module. The built-in test module may be incorporated into the distributed control module. The fault state may include no faults, a communication fault, a sensor operation fault, or a controllable component fault. The distributed control module may be configured to transmit a closed-loop control command from the distributed control module to a controllable component when the fault state comprises no faults, or transmit an augmented control command from the distributed control module to the controllable component when the fault state comprises a communication fault or a sensor operation fault, or transmit a disconnect control command from the distributed control module to a controllable component when the fault state comprises a controllable component fault.

20 Claims, 13 Drawing Sheets

(56) References Cited

U.S. PATENT DOCUMENTS

| | | |
|---|---|---|
| 4,470,093 A | 9/1984 | Yamaura |
| 4,760,487 A | 7/1988 | Kwong et al. |
| 5,486,997 A | 1/1996 | Reismiller et al. |
| 5,541,486 A | 7/1996 | Zoller et al. |
| 5,547,337 A | 8/1996 | Fork et al. |
| 5,673,668 A | 10/1997 | Pallett et al. |
| 5,806,805 A | 9/1998 | Elbert |
| 5,809,045 A | 9/1998 | Adamiak et al. |
| 5,958,060 A | 9/1999 | Premerlani |
| 6,148,267 A | 11/2000 | Permerlani |
| 6,285,917 B1 | 9/2001 | Sekiguchi et al. |
| 6,311,307 B1 | 10/2001 | Adamiak et al. |
| 6,342,880 B2 | 1/2002 | Rosenberg et al. |
| 6,456,947 B1 | 9/2002 | Adamiak et al. |
| 6,571,182 B2 | 5/2003 | Adamiak et al. |
| 6,678,134 B2 | 1/2004 | Sugiura et al. |
| 6,813,527 B2 | 11/2004 | Hess |
| 6,912,855 B2 | 7/2005 | Bescherer et al. |
| 6,915,219 B2 | 7/2005 | Premerlani |
| 7,126,800 B2 | 10/2006 | Premerlani et al. |
| 7,444,248 B2 | 10/2008 | Premerlani et al. |
| 7,472,026 B2 | 12/2008 | Premerlani et al. |
| 7,567,881 B2 | 7/2009 | Kasztenny et al. |
| 8,154,836 B2 | 4/2012 | Kastenny et al. |
| 8,963,558 B2 | 2/2015 | Pan et al. |
| 10,099,796 B2 | 10/2018 | Spack |
| 2002/0060497 A1 | 5/2002 | Arita et al. |
| 2011/0063766 A1 | 3/2011 | Kasztenny et al. |
| 2011/0180656 A1* | 7/2011 | Shue ................ G05B 19/0428 244/17.13 |
| 2011/0251739 A1* | 10/2011 | Tomas ................ G05D 1/0077 701/3 |
| 2012/0299578 A1* | 11/2012 | Korrek .................. H03M 1/207 324/76.15 |
| 2015/0123684 A1* | 5/2015 | Kurokawa ....... G01R 31/31813 324/750.3 |
| 2015/0226791 A1* | 8/2015 | Kurokawa ......... G01R 31/2884 324/750.3 |
| 2015/0226802 A1* | 8/2015 | Kurokawa ....... G01R 31/31919 324/762.01 |
| 2015/0331040 A1* | 11/2015 | Bernon-Enjalbert ... H01L 21/22 324/750.3 |
| 2016/0070277 A1* | 3/2016 | Price ...................... H01L 22/30 324/123 R |

FOREIGN PATENT DOCUMENTS

| | | |
|---|---|---|
| EP | 2374714 A2 | 10/2011 |
| WO | WO98/11641 | 3/1998 |

OTHER PUBLICATIONS

Adamiak et al., A New Approach to Current Differential Protection for Transmission Lines, Electrical Council of New England, Oct. 22-23, 1988, pp. 1-16.

Culley, The Need and Challenges for Distributed Engine Control, GT2013-96081, National Aeronautics and Space Administration (NASA), ASME Turbo Expo 2013, Jun. 3-7, 2013, San Antonio, Texas, 28 Pages.

Garg et al., Advanced Control of Turbomachinery Based Aero-Propulsion Systems, Glenn Research Center, Intelligent Control and Autonomy Branch at Lewis Field, NASA, 49 Pages.

European Search Report Corresponding to Application No. 20162148 dated Jul. 28, 2020.

* cited by examiner

| FAULT STATE 502 | RESPONSE STATE 504 | CONTROL REGIME 506 |
|---|---|---|
| NO FAULTS 508 | NOMINAL CLOSED-LOOP CONTROL 528 | CLOSED-LOOP 530 |
| COMMUNICATION FAULT 510 — TEMPORARY COMM. FAULT 516 | USE PREVIOUS CONTROL COMMAND AND/OR PREVIOUS COMMAND REFERENCE IN CLOSED-LOOP CONTROL 532 | AUGMENTED CLOSED-LOOP 534 |
| LOCAL SENSOR FAULT 518 | USE BACKUP SENSOR CHANNEL IN CLOSED-LOOP CONTROL 536 | AUGMENTED CLOSED-LOOP 538 |
| MPU COMM. FAULT 520 | USE PRE-SET COMMAND REFERENCE AND/OR PREVIOUS CONTROL COMMAND IN CLOSED-LOOP CONTROL 540 | AUGMENTED CLOSED-LOOP 542 |
| SENSOR OPERATION FAULT 512 | USE OPEN-LOOP CONTROL 544 | OPEN-LOOP 546 |
| CRITICAL FAULT 514 — PROCESSOR FAULT 522, MEMORY FAULT 524, CONTROLLABLE COMPONENT FAULT 526 | DISCONNECT CONTROLLER FROM CONTROLLABLE COMPONENT 548 | DISCONNECTED 550 |

*FIG. 5*

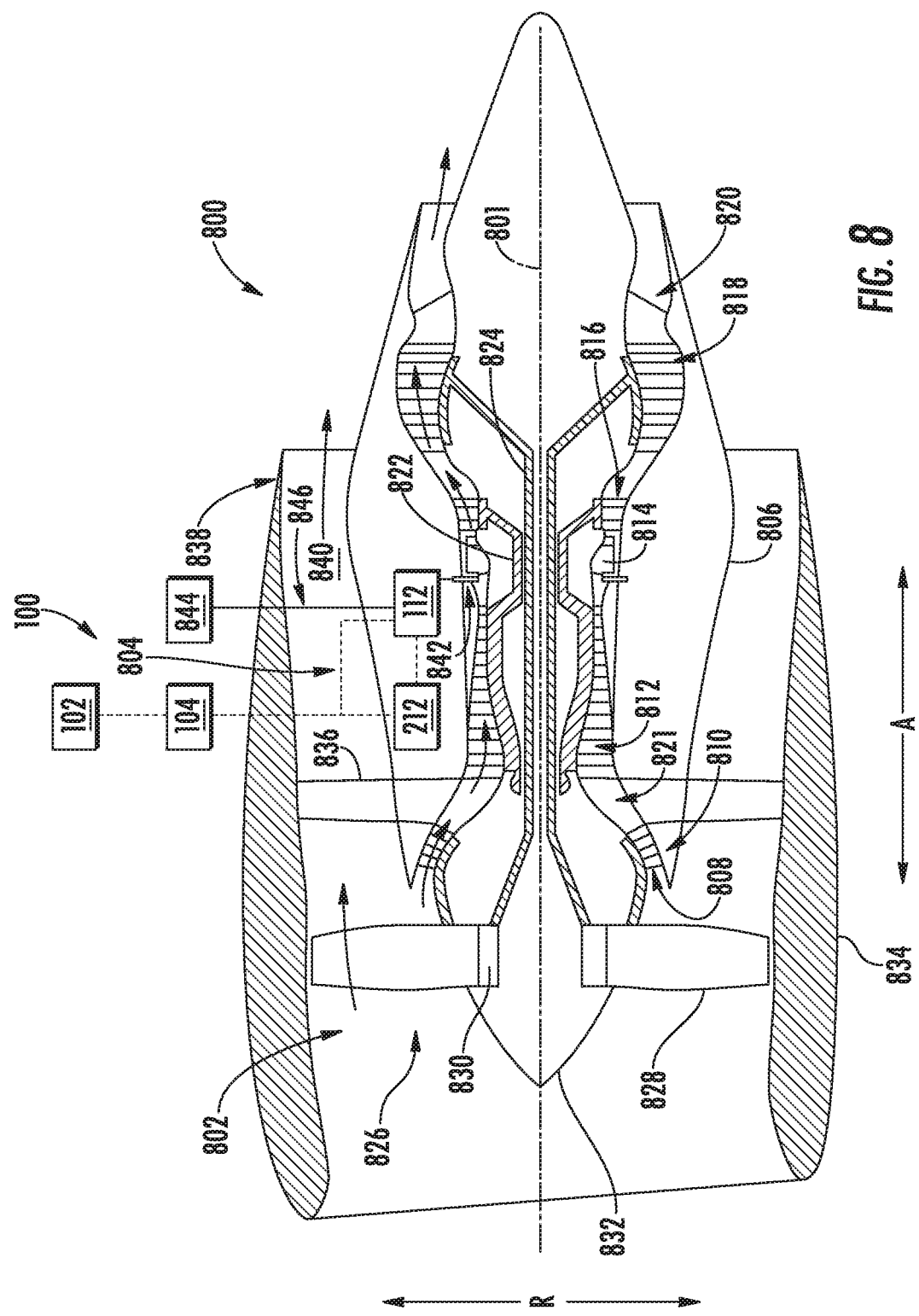

DISTRIBUTED CONTROL MODULES WITH BUILT-IN TESTS AND CONTROL-PRESERVING FAULT RESPONSES

FIELD

The present disclosure generally pertains to distributed control systems, and more particularly to distributed control systems that include distributed control modules with built-in tests for determining faults and control-preserving fault responses.

BACKGROUND

Distributed control systems generally provide increased reliability by localizing control commands to various distributed control modules associated with corresponding controllable components. When an individual distributed control module fails, the failure is typically isolated to the individual distributed control module. However, even an isolated failure of an individual distributed control module may be highly undesirable, especially for a mission-critical distributed control module. For example, distributed control systems are used in connection with turbomachines to control various controllable components associated with the turbomachine, such as servo motors or actuators operable for controlling fuel valves, stator vane positions, air bleed valve positions, and so forth.

Continued control of such turbomachine controllable components is of high importance, as a distributed control module failure or fault associated with any of these controllable components may result in a loss of control of the controllable component and thereby reduce the operating efficiency or capability of the turbomachine or may even render the turbomachine inoperable. A sudden failure or fault of a distributed control module may also damage the turbomachine. Additionally, a fault or failure associated with a main processing unit responsible for supervisory control of a network of distributed control modules may impact the entire network of distributed control modules, including in some instances rendering the entire network of distributed control modules inoperable.

Accordingly, there exists a need for improved distributed control systems, including distributed control systems with distributed control modules that have improved capabilities to preserve controllability of controllable components in the event of a failure or fault state.

BRIEF DESCRIPTION

Aspects and advantages will be set forth in part in the following description, or may be obvious from the description, or may be learned through practicing the presently disclosed subject matter.

In one aspect, the present disclosure embraces methods of responding to faults associated with a distributed control module. An exemplary method includes determining a fault state associated with a control loop using a built-in test module. The built-in test module may be incorporated into a distributed control module, and the fault state may include no faults, a communication fault, a sensor operation fault, or a critical fault. The exemplary method may include transmitting a closed-loop control command from the distributed control module to a controllable component when the fault state comprises no faults, or transmitting an augmented control command from the distributed control module to the controllable component when the fault state comprises a communication fault or a sensor operation fault, or transmitting a disconnect control command from the distributed control module to the controllable component when the fault state comprises a critical fault.

In another aspect, the present disclosure embraces distributed control systems. An exemplary distributed control system may include a main processing unit, a distributed control module, and a controllable component. The distributed control module may be configured to determine a fault state associated with a control loop using a built-in test module. The built-in test module may be incorporated into the distributed control module. The fault state may include no faults, a communication fault, a sensor operation fault, or a controllable component fault. The distributed control module may be configured to transmit a closed-loop control command from the distributed control module to a controllable component when the fault state comprises no faults, or transmit an augmented control command from the distributed control module to the controllable component when the fault state comprises a communication fault or a sensor operation fault, or transmit a disconnect control command from the distributed control module to the controllable component when the fault state comprises a controllable component fault.

In yet another aspect, the present disclosure embraces computer readable medium. Exemplary computer readable medium may include computer-executable instructions, which, when executed by one or more processors of distributed control module, cause the distributed control module to determine a fault state associated with a control loop using a built-in test module. The built-in test module may be incorporated into a distributed control module. The fault state may include no faults, a communication fault, a sensor operation fault, or a controllable component fault. Exemplary computer readable medium may additionally or alternatively include computer-executable instructions, which, when executed by one or more processors of distributed control module, cause the distributed control module to transmit a closed-loop control command from the distributed control module to a controllable component when the fault state comprises no faults, or transmit an augmented control command from the distributed control module to the controllable component when the fault state comprises a communication fault or a sensor operation fault, or transmit a disconnect control command from the distributed control module to the controllable component when the fault state comprises a controllable component fault.

These and other features, aspects and advantages will become better understood with reference to the following description and appended claims. The accompanying drawings, which are incorporated in and constitute a part of this specification, illustrate exemplary embodiments and, together with the description, serve to explain certain principles of the presently disclosed subject matter.

BRIEF DESCRIPTION OF THE DRAWINGS

A full and enabling disclosure, including the best mode thereof, directed to one of ordinary skill in the art, is set forth in the specification, which makes reference to the appended Figures, in which:

FIG. 5 shows an exemplary fault state table that includes fault states that may be determined by a built-in test module;

FIG. 8. shows a schematic, cross-sectional view of a turbofan engine that includes a distributed control system with a distributed control module configured according to the present disclosure.

Figure 1:
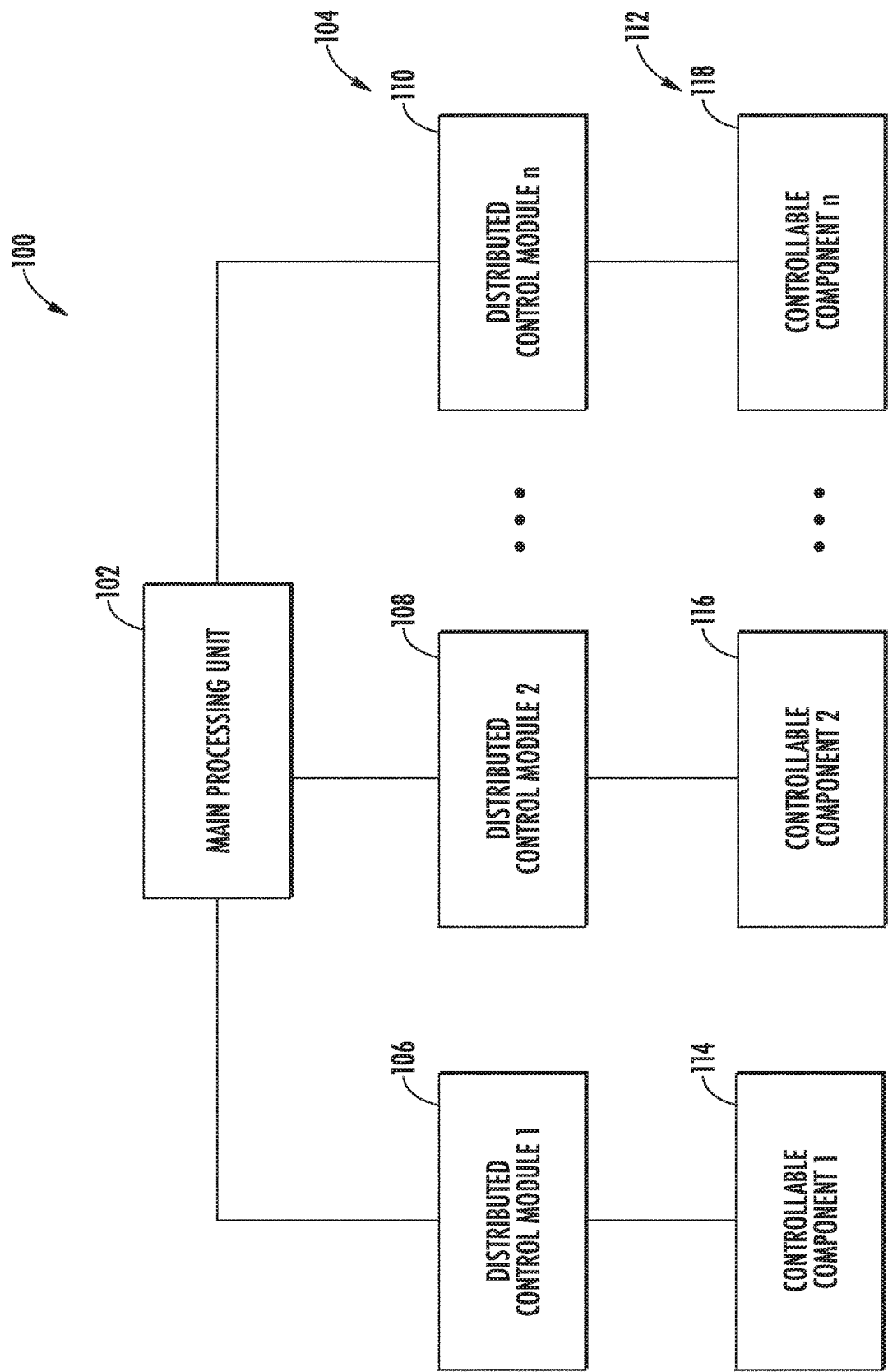
FIG. 1 shows a block diagram depicting an exemplary distributed control system.

Repeat use of reference characters in the present specification and drawings is intended to represent the same or analogous features or elements of the present disclosure.

DETAILED DESCRIPTION

Reference now will be made in detail to exemplary embodiments of the presently disclosed subject matter, one or more examples of which are illustrated in the drawings. Each example is provided by way of explanation and should not be interpreted as limiting the present disclosure. In fact, it will be apparent to those skilled in the art that various modifications and variations can be made in the present disclosure without departing from the scope or spirit of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

The present disclosure generally provides distributed control systems and distributed control modules that are configured to provide various control regimes associated with certain fault states. The fault states may be determined by a built-in test module, which may be incorporated into the distributed control module. The control regimes may be configured to preserve control of a controllable component even in the presence of a fault state by providing augmented control commands responsive to the fault state. For example, a distributed control module may preserve closed-loop control of a controllable component by providing an augmented closed-loop control regime, and as such, a control command module may output a closed-loop control command notwithstanding the presence of a communication fault. The distributed control module may also provide open-loop control in the event of a sensor operation fault pertaining to a sensor used in a closed-loop control regime (e.g., a nominal closed-loop control regime and/or an augmented closed-loop control regime). In some embodiments, a distributed control module may disconnect control of a controllable component only in the event of a critical fault, while preserving control of the controllable component through one or more control regimes (e.g., a closed-loop control regime, an augmented closed-loop control regime, and/or an open-loop control regime) in the event of fault states that do not include a critical fault.

It is understood that terms "upstream" and "downstream" refer to the relative direction with respect to fluid flow in a fluid pathway. For example, "upstream" refers to the direction from which the fluid flows, and "downstream" refers to the direction to which the fluid flows. It is also understood that terms such as "top", "bottom", "outward", "inward", and the like are words of convenience and are not to be construed as limiting terms. As used herein, the terms "first", "second", and "third" may be used interchangeably to distinguish one component from another and are not intended to signify location or importance of the individual components. The terms "a" and "an" do not denote a limitation of quantity, but rather denote the presence of at least one of the referenced item.

Here and throughout the specification and claims, range limitations are combined and interchanged, and such ranges are identified and include all the sub-ranges contained therein unless context or language indicates otherwise. For example, all ranges disclosed herein are inclusive of the endpoints, and the endpoints are independently combinable with each other.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems.

Exemplary embodiments of the present disclosure will now be described in further detail. FIG. 1 shows an exemplary distributed control system 100. The distributed control system 100 may include a control system for a turbomachine or any other engine, machine, process, or plant, and may include a large number of distributed control modules distributed throughout the distributed control system 100. By way of example, a distributed control system 100 may include or be incorporated into a full authority direct engine control (FADEC) system or an engine control unit (ECU) for a turbomachine and/or an aircraft.

As shown, an exemplary distributed control system 100 may include a main processing unit 102, one or more distributed control modules 104, and one or more controllable components 112 respectively associated with corresponding distributed control modules 104. The distributed control system 100 distributes control processing among the distributed control modules 104. Typically, the main processing unit 102 provides centralized, supervisory control for the distributed control modules 104, and the respective distributed control modules 104 implement one or more control loops for controlling one or more controllable components 112 associated with the corresponding distributed control module 104 according to the supervisory control from the main processing unit 102. A main processing unit 102 may include a data warehouse and a server configured to transmit data from the data warehouse to distributed control modules 104 and/or to receive data from the distributed control modules 104 and to store the received data in the data warehouse for further purposes.

Operations and methods associated with a distributed control system 100, including operations and methods associated with a distributed control module 104, may be implemented within the context of a turbomachine 800 (FIG. 8), such as a turbomachine 800 installed on an aircraft. The operations and methods described herein may be carried out, for example, during flight, as well as during pre-flight and/or post-flight procedures.

Any number of distributed control modules 104 may be provided. By way of example, the exemplary distributed control system 100 shown in FIG. 1 includes a first distributed control module 106, a second distributed control module 108, and an Nth distributed control module 110. A distributed control module 104 may be associated with one or more controllable components 112. By way of example, the exemplary distributed control system 100 shown in FIG. 1 includes a first controllable component 114 associated with the first distributed control module 106, a second controllable component 116 associated with the second distributed control module 108, and an Nth controllable component 118 associated with the Nth distributed control module 110. However, it will be appreciated that a plurality of controllable components 112 may be associated with an individual distributed control module 104, and/or that an individual controllable component 112 may be associated with a plurality of distributed control modules 104.

By way of example, a controllable component 112 may include an actuator or a servo-actuator, and a sensor may include a position sensor configured to measure a position of the actuator or servo-actuator. As another example, a controllable component 112 may include a variable-geometry component, or an actuator or servo-actuator coupled to a variable-geometry component. Exemplary variable-geometry components include fuel valves, variable-position fan blades, variable-position guide vanes, variable-position compressor blades, and variable-position turbine blades.

Figure 2:
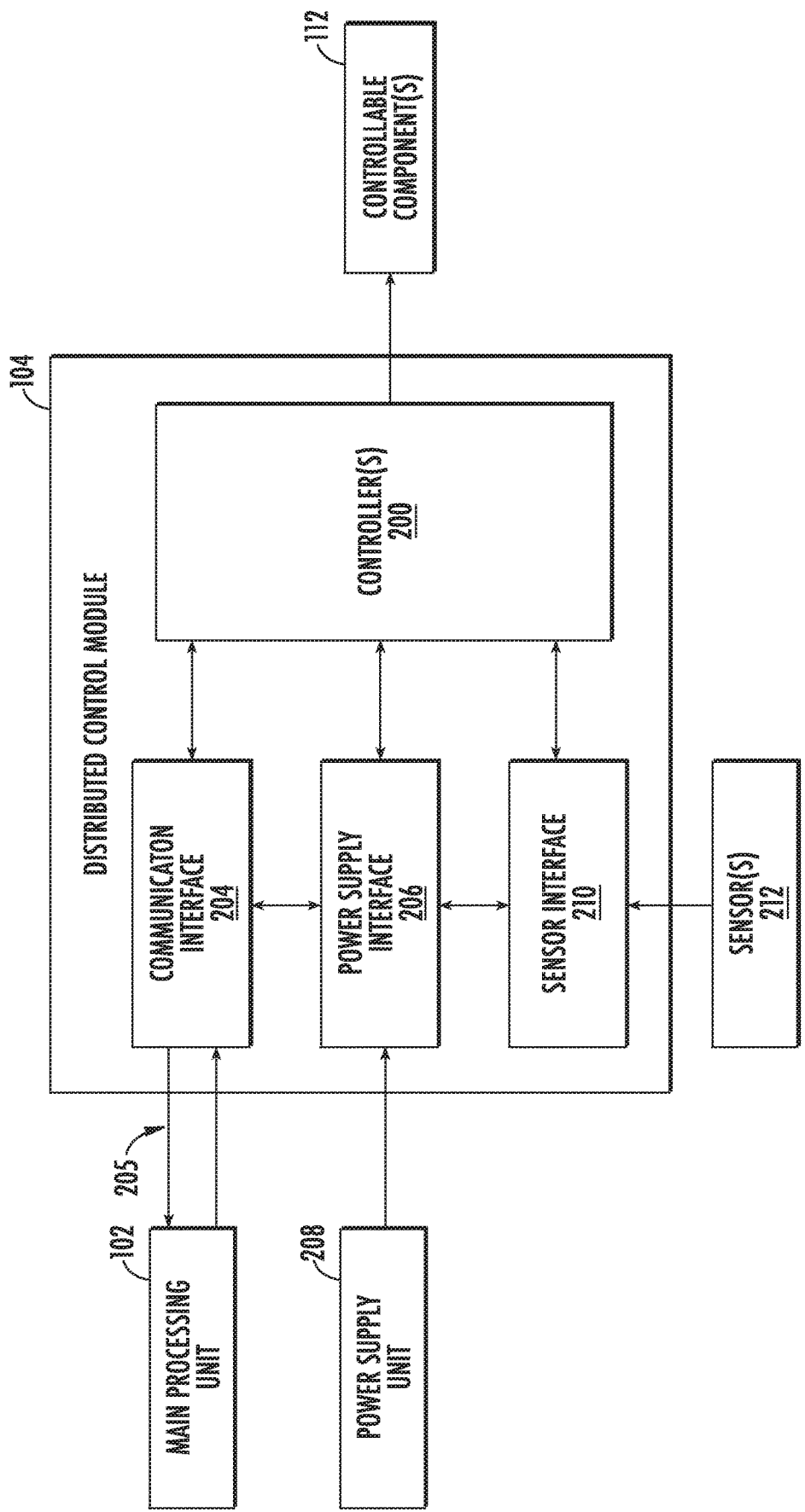
FIG. 2 shows a block diagram depicting an exemplary distributed control module that may be included in a distributed control system.

An exemplary distributed control module 104 is shown in FIG. 2. As shown, a distributed control module 104 may include one or more controllers 200 communicatively coupled to a main processing unit 102 and one or more controllable components 112. The controller may be configured to control the one or more controllable components 112 by implementing a control loop or combination of control loops under supervisory control from the main processing unit 102. Exemplary control loops that may be implemented by the controller 200 include open-loop control, closed-loop control, as well as a combination thereof.

As used herein, the terms "open-loop" or "open-loop control" generally refer to a control loop or control command that does not receive feedback from a measured output variable of a system subject to such control loop or control command.

As used herein, the terms "closed-loop" or "closed-loop control" generally refer to a control loop or control command that utilizes as an input or depends on feedback from, a measured output variable of a system subject to such control loop or control command. Such a measured output variable may include a measurement from a sensor configured to measure a system variable that depends on an input by such control loop or control command. A controller 200 that utilizes closed-loop control may compare a measured output variable to a setpoint to determine an error value, which may be used, for example, in a PID control model or any other desired control model.

An exemplary distributed control module 104 may include a communication interface 204 configured to communicatively couple the distributed control module 104 and the main processing unit 102 via wired or wireless communication lines 205. The communication lines 205 may include a data bus or a combination of wired and/or wireless communication links. The communication interface 204 may include any suitable components for interfacing with one or more network(s), including for example, data busses, transmitters, receivers, ports, controllers, antennas, and/or other suitable components. An exemplary distributed control module 104 may additionally include a power supply interface 206 operably coupled to a power supply unit 208, and a sensor interface 210 operably coupled to one or more sensors 212.

Figure 3:
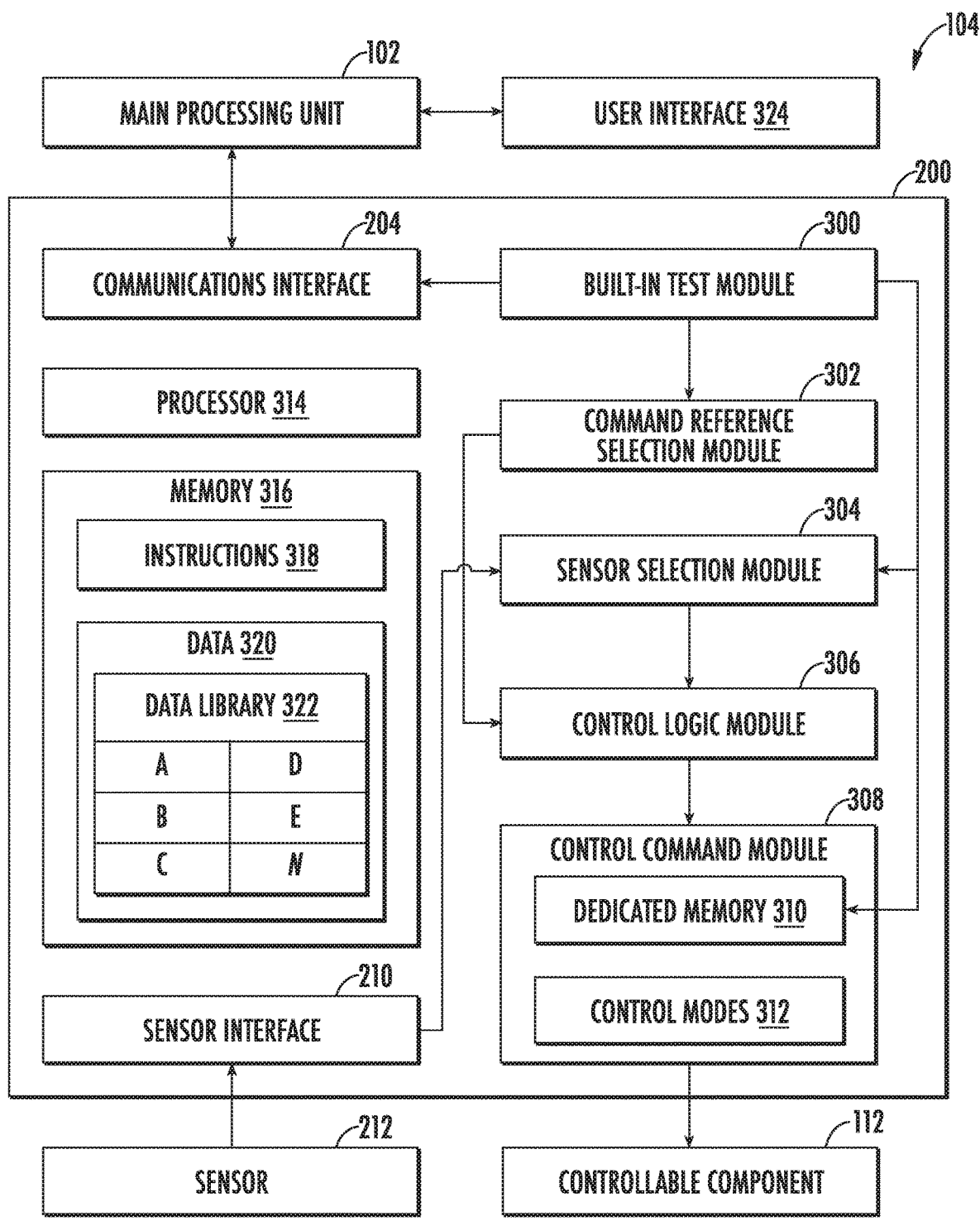
FIG. 3 shows a block diagram depicting an exemplary controller of a distributed control module.

Now turning to FIG. 3, an exemplary controller 200 of a distributed control module 104 will be described. As shown, an exemplary controller 200 may include a built-in test module 300, a command reference selection module 302, a sensor selection module 304, a control logic module 306, and a control command module 308.

The built-in test module 300 may perform various built-in tests configured to determine a fault state for a control loop handled by the controller 200 or the distributed control module 104. The built-in test module 300 may also transmit an indication of a fault state to other modules associated with the controller 200 or the distributed control module 104, and/or to the main processing unit 102.

The command reference selection module 302 may be configured to select a command reference for use in control logic of a control loop handled by the controller 200 or the distributed control module 104. The command reference may be selected, for example, based at least in part on an indication from the built-in test module 300 of a status or fault state for the control loop. The command reference selection module 302 may be configured to select from among a number of possible command references for use in the control loop, or to cause another module associated with the controller 200 to utilize one of a number of possible command references in the control loop. By way of example, the command reference selection module 302 may be configured to select from among, or to cause another module associated with the controller 200 to utilize in the control loop, a nominal command reference, a previous command reference, or a pre-set command reference.

A nominal command reference refers to a command reference provided by the main processing unit 102. For example, a main processing unit 102 may transmit a command reference to the distributed control module 104, such as via the communication interface 204, on a periodic clock schedule. A nominal command reference refers to a command reference received according normal operating conditions of the distributed control module 104. A nominal command reference may have a validity period that corresponds to the periodic clock schedule. Subsequent command references may supplant the preceding nominal command reference and the preceding nominal command reference may become a previous command reference. Such a previous command reference may be retained, however, such as in memory of the distributed control module. A previous command reference may be utilized by the controller 200, for example, when a subsequent command reference is not available.

A pre-set command reference refers to a command reference that has been pre-defined, such as according to a static or dynamic input. A pre-set command reference may be user-defined, or a pre-set command reference may be determined based on one or more inputs. For example, a pre-set command reference may be determined based on previous command references. In one embodiment, a pre-set command reference may be determined based on an average of previous command references over an operating interval of the control loop, such as a period of time or such as under specified operating conditions.

A pre-set command reference may be utilized by the controller 200, for example, when a subsequent command reference is not available, and/or a previous command reference may be considered as being potentially unreliable or less reliable than the pre-set command reference. By way of example, a pre-set command reference may be selected over a previous command reference when the previous command reference corresponds to a time that is too far into the past to be considered reliable, or when a previous command reference corresponds to operating conditions that may differ from present operating conditions. In these instances, a pre-set command reference may be selected that corresponds to the current operating conditions.

The sensor selection module 304 may be configured to select from among a plurality of sensor channels associated with a sensor 212, and/or from among a plurality of sensors 212 associated the controller 200 or the distributed control module 104. Such a sensor 212 or plurality of sensors 212 may be configured to measure a system variable of a controllable component 112 or controllable components 112, such as a position of the controllable component(s) 112 or a process output associated with the controllable component(s) 112. In some embodiments, a control loop may utilize a default or preferred channel for determining inputs from a sensor 212, and a backup or alternative channel may also be provided such that the control loop may alternatively utilize the backup channel for the sensor 212. Additionally, or in the alternative, a default or preferred sensor 212 may be provided, and a backup or alternate sensor 212 may also be provided, such that the control loop may utilize the default or preferred sensor 212 and/or the backup or alternate sensor 212. The sensor selection module 304 may select a channel for a sensor 212 from among a plurality of channels and/or the sensor selection module 304 may select a sensor 212 from among a plurality of sensors 212, for example, based at least in part on an indication from the built-in test module 300 of a status or fault state for the control loop.

The control logic module 306 may be configured to process control logic associated with one or more control loops handled by the controller 200 or the distributed control module 104, including control logic for one or more closed-loop and/or open-loop controls. The control logic may include machine-executable instructions that can be executed by one or more processors associated with the controller 200 or the distributed control module 104. The control logic may be selected by the control logic module 306, for example, based at least in part on an indication from the built-in test module 300 of a status or fault state for the control loop.

The control command module 308 may include dedicated memory 310. The dedicated memory 310 may be configured to store supervisory control commands and/or command references, such as those received from the main processing unit 102. The dedicated memory 310 may be utilized to allow control commands and/or command references to be accessible by the controller 200 or the distributed control module 104 in the event of an interruption in communications with the main processing unit 102, including an intermittent, temporary, or extended interruption in communication.

The control command module 308 may also include one or more control modes 312, including one or more closed loop control modes, one or more open loop control modes, and/or a disconnect control mode. The control modes may be selected by the control command module 308, for example, based at least in part on an indication from the built-in test module 300 of a status or fault state for the control loop.

The controller 200 may include one or more computing devices, including one or more processors 314 and one or more memory devices 316, and such computing devices are preferably located locally to the distributed control module 104. The one or more processors 314 may include any suitable processing device, such as a microprocessor, microcontroller, integrated circuit, logic device, and/or other suitable processing device. The one or more memory devices 316 may include one or more computer-readable media, including but not limited to non-transitory computer-readable media, RAM, ROM, hard drives, flash drives, and/or other memory devices 316.

The one or more memory devices 316 may store information accessible by the one or more processors 314, including machine-executable instructions 318 that can be executed by the one or more processors 314. The instructions 318 may include any set of instructions 318 which when executed by the one or more processors 314 cause the one or more processors 314 to perform operations. In some embodiments, the instructions 318 may be configured to cause the one or more processors 314 to perform operations, including operations for which the controller 200, the distributed control module 104, and/or the one or more computing devices are configured. More particularly, such operations may include operations of the built-in test module 300, operations of the command reference selection module 302, operations of the sensor selection module 304, operations of the control logic module 306, and/or operations of the control command module 308.

Such operations may include controlling the one or more controllable components 112 according to a control loop as described herein. Such operations may additionally or alternatively include receiving inputs from the one or more sensors 212 and controlling the one or more controllable components 112 responsive to the one or more sensors 212 according to a control loop. Such operations may additionally or alternatively be carried out according to supervisory control provided by the main processing unit 102. The machine-executable instructions 318 can be software written in any suitable programming language or can be implemented in hardware. Additionally, and/or alternatively, the instructions 318 can be executed in logically and/or virtually separate threads on processors 314.

The memory devices 316 may store data 320 accessible by the one or more processors 314. The data 320 can include current or real-time data, past data, or a combination thereof. The data 320 may be stored in a data library 322. As examples, the data 320 may include data 320 associated with or generated by the main processing unit 102, the one or more sensors 212, and/or the distributed control module 104, including data 320 associated with or generated by a controller 200 or a processor 314. The data 320 may also include other data sets, parameters, outputs, information, associated with the distributed control module 104 or the distributed control system 100.

The communication interface 204 may additionally or alternatively allow the distributed control module 104 and/or the main processing unit 102 to communicate with a user interface 324.

Figure 4:
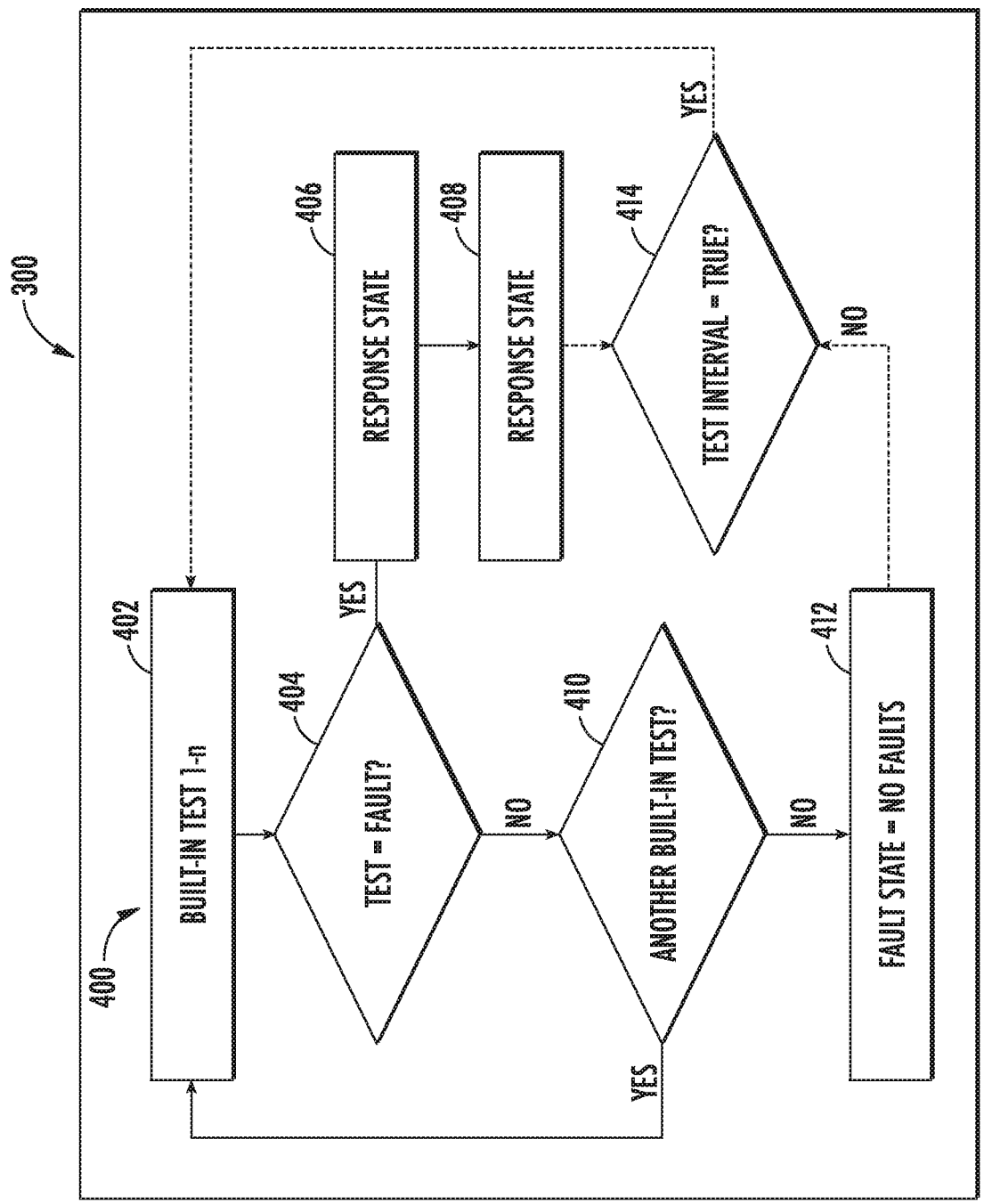
FIG. 4 shows a block diagram depicting an exemplary built-in test module and operations thereof, which may be incorporated into a distributed control module or controller of a distributed control module.

Now referring to FIG. 4, an exemplary built-in test module 300 will be described in further detail. A built-in test module 300 may be utilized in a method of determining a fault state 400. A built-in test module 300 have one or more built-in tests associated therewith, such as built-in tests 1 through n, as indicated by block 402.

Exemplary built-in tests include, by way of example, communication built-in tests, processing built-in tests, sensor built-in tests, and controllable component built-in tests. A communication built-in test may include checking for a fault state associated with memory, protocol, and/or messages associated with communication, such as communications between the main processing unit 102 and the distributed control module 104. A processing built-in test may include checking for a fault state associated with memory 316 and/or logic of a processor 314 associated with the distributed control module 104. A sensor built-in test may include checking for a fault state associated with a sensor 212 to the distributed control module 104, such as those associated with inputs from the sensor 212, open or short circuits associated with the sensor 212, range values, and so forth. A controllable component built-in test may include checking for a fault state associated with a controllable component 112 associated with a distributed control module 104, such as those associated with inputs from the sensor 212, open or short circuits associated with the sensor 212, range values, and so forth.

A method of determining a fault state 400 may be performed in respect of one or more built-in tests 402, including all or a subset of built-in tests 402 associated with a built-in test module 300. An exemplary method 400 may include, at block 402 performing a built-in test, and at block 404, determining whether the built-in test indicates the presence of a fault (e.g., "TEST=FAULT?").

When the built-in test indicates the presence of a fault at block 404, the method 400 may include, at block 406, determining the fault state. One or more fault states may be associated with the fault determined using the performed built-in test 402. The exemplary method 400 may additionally include, at block 408 determining a response state corresponding to the fault state determined at block 406.

When the built-in test does not indicate the presence of a fault, or when the built-in test indicates the absence of a fault, at block 404, the exemplary method 400 may determine, at block 410, whether the built-in test module 300 includes another built-in test to be performed. When there is another built-in test to be performed, the exemplary method 400 may return to block 402, to perform the additional built-in test. From block 402, when there are no additional built-in tests, at block 410, the exemplary method 400 determines a fault state equals no faults, at block 412.

In some embodiments, a built-in test module 300 may be configured to perform one or more built-in tests at a predetermined test interval. In an exemplary method 400, a built-in test module 300 may determine whether a test interval has elapsed (e.g., "TEST INTERVAL=TRUE?") at block 414. The test interval may be determined for one or more built-in tests. When the test interval has elapsed, the exemplary method may return to block 402, to perform the one or more built-in tests.

In exemplary embodiments, a controller 200 or a distributed control module 104 may be configured to output a control command that depends, at least in part, on a response state determined by a build-in test module 300. By way of example, FIG. 5 show a fault state table 500 that includes exemplary fault states 502, exemplary response states 504 corresponding to respective fault states 502, and exemplary control regimes 506 corresponding to respective response states 504. Additionally, FIGS. 6A-6F respectively show exemplary control loops 600 corresponding to the control regimes 506 (and fault states 502 and/or response states 504) shown in FIG. 5.

As shown in FIG. 5, exemplary fault states 502 may include no faults 508, communication faults 510, sensor operation faults 512, and/or critical faults 514. Exemplary communication faults 510 may include a temporary communication fault 516, a local sensor fault 518, and/or a main processing unit communication fault 520. A temporary communication fault 516 may include a short-term or intermittent communication issue between the main processing unit 102 and the distributed control module 104. A local sensor fault 518 may include a fault associated with communication from a sensor interface 210 to the distributed control module 104, such as a fault pertaining to a particular channel for communications between the sensor 212 and the sensor interface 210, or memory 316 associated with the sensor interface 210 for such channel. A local sensor fault 518 may be an analog or a digital fault, and may include both communication faults, as well as sensor circuit faults, A/D faults, and so forth. A sensor operation fault 512 may include a fault associated with the operation of a sensor 212, including an outage or failure of the sensor 212, such as a short circuit, an over-current, or a position error. A main processing unit communication fault 520 may include a long-term or critical communication issue between the main processing unit 102 and the distributed control module 104. For example, a main processing unit communication fault 520 may include an outage or failure of the main processing unit 102, or a failure involving the communication interface 204, such as a fault pertaining to memory 316 associated with the communication interface 204.

Exemplary critical faults 514 may include a processor fault 522, a memory fault 524, and/or a controllable component fault 526. A processor fault 522 may include a fault pertaining to a processor 314 associated with the distributed control module 104, including a processing logic failure or a processor memory failure. A memory fault 524 may include a fault pertaining to memory 316 associated with the distributed control unit, including a memory failure, a fault associated with instructions 318, a fault associated with data 320 or a data library 322, such as a data corruption fault. A controllable component fault 526 may include a fault associated with the operation of a controllable component 112, including an outage or failure of the controllable component 112, such as a short circuit, an over-current, or a control error.

Still referring to FIG. 5, exemplary response states 504 may include nominal closed-loop control 528 when the fault state 502 is no faults 508, and a corresponding control regime 506 may include a closed-loop control regime 530. When the fault state 502 includes a communication fault 510, a corresponding control regime 506 may include an augmented closed-loop control regime 534, 538, 542. For example, when the communication fault 510 includes a temporary communication fault 516, the response state 504, at block 532, may provide for using a previous command reference from the main processing unit 102 in closed-loop control. A corresponding augmented closed-loop control regime 534 may include a closed loop control command that utilizes a previous control command from the main processing unit 102 and/or a previous command reference from the main processing unit 102. When communication fault 510 includes a local sensor fault 518, the response state 504 may provide for using a backup sensor channel in closed-loop control 536, and an augmented closed-loop control regime 538 may include a closed loop control command that utilizes a backup sensor channel. When communication fault 510 includes a main processing unit communication fault 520, the response state 504 may provide for using a pre-set command reference in closed-loop control 540, and an augmented closed-loop control regime 542 may include a closed loop control command that utilizes a pre-set command reference in closed-loop control. The pre-set command reference may be stored in memory 316, such as dedicated memory 310 of the control command module 308.

By contrast, exemplary response states 504 may include using open-loop control 544 when the fault state 502 includes a sensor operation fault 512, and a corresponding control regime 506 may include an open-loop control regime 546. Thus, in some embodiments, a distributed control module 104 may be configured to maintain closed-loop control even in the presence of a communication fault 510, thereby reverting to open-loop control in a more limited set of fault states 502 such as in the event of a sensor operation fault 512.

In some embodiments, a response state 504 to certain critical faults 514 may include, at block 548, disconnecting the controller 200 from the controllable component 112 and a corresponding control regime may include a disconnect control regime 550. For example, a response state 504 may include disconnecting the controller 200 from the controllable component 112 when the critical fault 514 includes a processor fault 522, a memory fault 524, and/or a controllable component fault 526. The disconnect control command may be executed physically, such as via a physical switch, and/or logically or virtually via instructions 318 executed by a processor 314 associated with the controller 200. The presently disclosed distributed control modules 104 may minimize the number of fault states 502 that lead to a disconnected control regime 550, for example, through the user of augmented closed-loop control regimes 534, 538, 542, and/or open-loop control regimes 546.

Now referring further to FIGS. 6A-6F, control loops 600 corresponding to the exemplary control regimes 506 shown in FIG. 5 will be further described. A built-in test module 300 (FIGS. 3 and 4) may provide an indication of the fault state 502 to one or more modules, such as the control command module 308, the command reference module 303, the control logic module 306, and/or the sensor selection module 304.

Figure 6A:
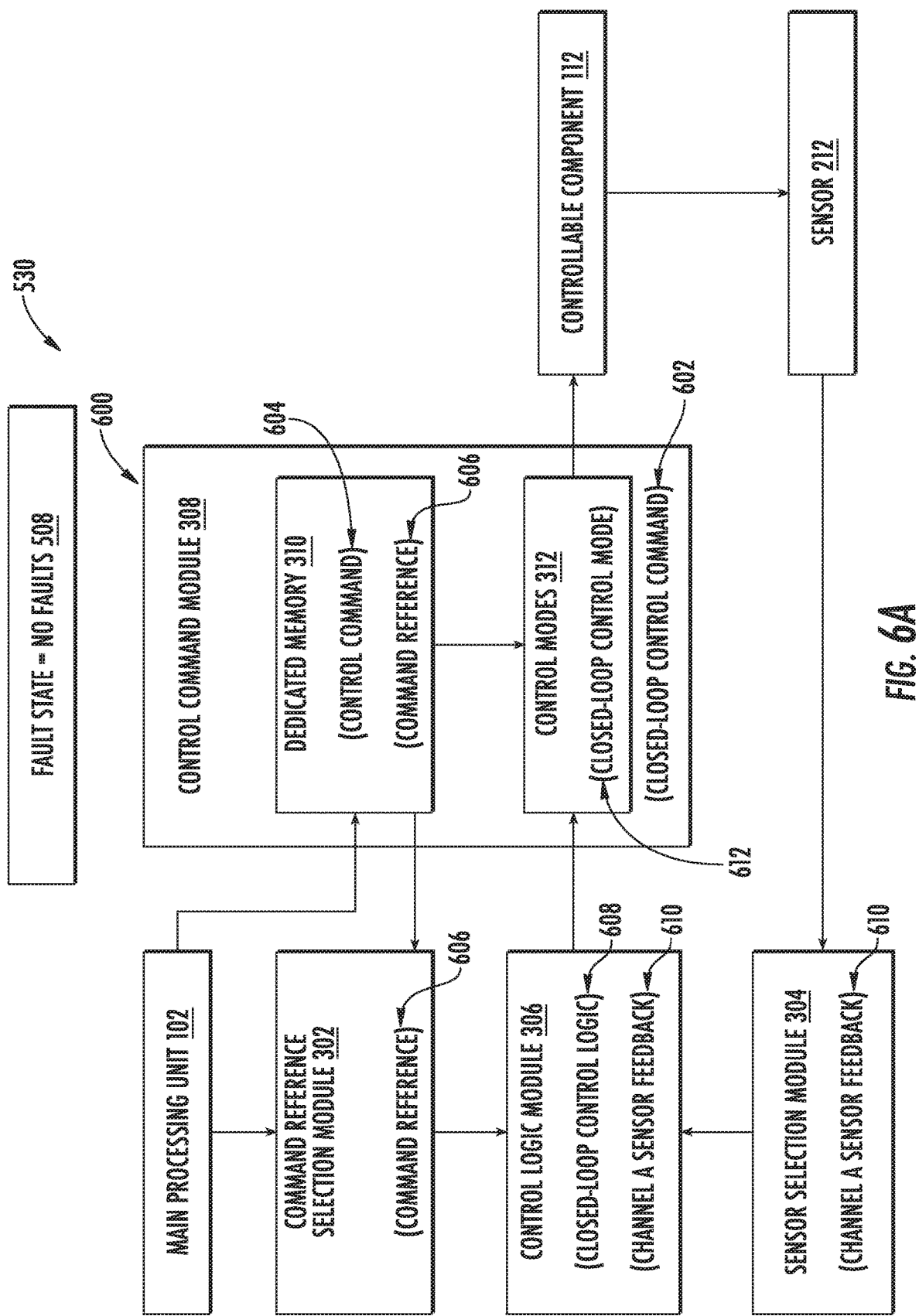
FIGS. 6A-6F show exemplary control loops corresponding to control regimes respectively associated with a fault state determined by the built-in test module.

FIG. 6A shows an exemplary control loop 600 corresponding to a nominal closed-loop control regime 530. The nominal closed-loop regime may be utilized when the built-in test module 300 provides an indication that the fault state 502 is no faults 508. As shown in FIG. 6A, with nominal closed-loop control regime 530, a control command module 308 may provide a closed-loop control command 602 to a controllable component 112. The control command module 308 may receive a control command 604 and/or a command reference 606 from the main processing unit 102.

The main processing unit 102 may be configured to provide the control command 604 and/or the command reference 606 based at least in part on the fault state 502 being no faults 508. For example, the main processing unit 102 may receive an indication from the built-in test module 300 that the fault state 502 is no faults 508. Additionally, or in the alternative, the control command module 308 may be configured to select the control command 604 and/or the command reference 606 based at least in part on an indication of the fault state 502 being no faults 508, such as based at least in part on such an indication from the built-in test module 300. The control command 604 and/or the command reference 606 may be stored in dedicated memory 310 of the control command module 308.

The command reference 606 may be provided to a command reference selection module 302, for example from the control command module 308 and/or from the main processing unit 102. Additionally, or in the alternative, the command reference selection module 302 may be configured to select the command reference 606 based at least in part on an indication of the fault state 502 being no faults 508, such as based at least in part on such an indication from the built-in test module 300. The command reference selection module 302 may provide the command reference 606 to a control logic module 306.

The control logic module 306 may include one or more control logic variants for use with various control regimes. For example, as shown in FIG. 6A, the control logic module 306 may include closed-loop control logic 608, among others. The control logic module 306 may be configured to select control logic such as the closed-loop control logic 608 based at least in part on an indication of the fault state 502 being no faults 508, such as based at least in part on such an indication from the built-in test module 300.

The control logic module 306 may also receive sensor feedback from a sensor 212 via one or more channels. For example, a sensor selection module 304 may be configured to select a sensor channel for providing sensor feedback from the sensor 212 to the control logic module 306. The sensor selection module 304 may be configured to select the sensor channel based at least in part on an indication of the fault state 502 being no faults 508, such as based at least in part on such an indication from the built-in test module 300. As shown, in FIG. 6A, sensor selection module 304 may select channel A sensor feedback 610 received from the sensor 212, and the sensor selection module 304 may provide such channel A sensor feedback 610 to the control logic module 306.

The control logic module 306 may process the control logic, such as the closed-loop control logic 608 using the command reference 606 from the command reference selection module 302 and/or the channel A sensor feedback 610 from the sensor selection module 304. For example, the control logic module 306 may utilize a processor 314 associated with the controller 200 to process such control logic. The control logic module 306 may output the processed control logic to the control command module 308. The processed control logic output to the control command module 308 may be in the form of a control command, such as a closed-loop control command 602.

The control command module 308 may include a plurality of control modes 312, including a closed-loop control mode 612. The control command module 308 may be configured to select a control mode 312 such as the closed-loop control mode 612 based at least in part on an indication of the fault state 502 being no faults 508, such as based at least in part on such an indication from the built-in test module 300.

The control command module 308 may receive a control command such as the closed-loop control command 602 from the control logic module 306. The control command module 308 may also be configured to select a control command received from the control logic module 306 such as the closed-loop control command 602 based at least in part on an indication of the fault state 502 being no faults 508, such as based at least in part on such an indication from the built-in test module 300.

The control command module 308 may output the control command, such as the closed-loop control command 602 to the controllable component 112 such that the controllable component 112 may be controlled by such control command (e.g., the closed-loop control command 602). The sensor 212 may determine a state of the controllable component 112, such as a measured position or value, and may provide sensor feedback, such as channel A sensor feedback 610, to the sensor selection module.

Figure 6B:
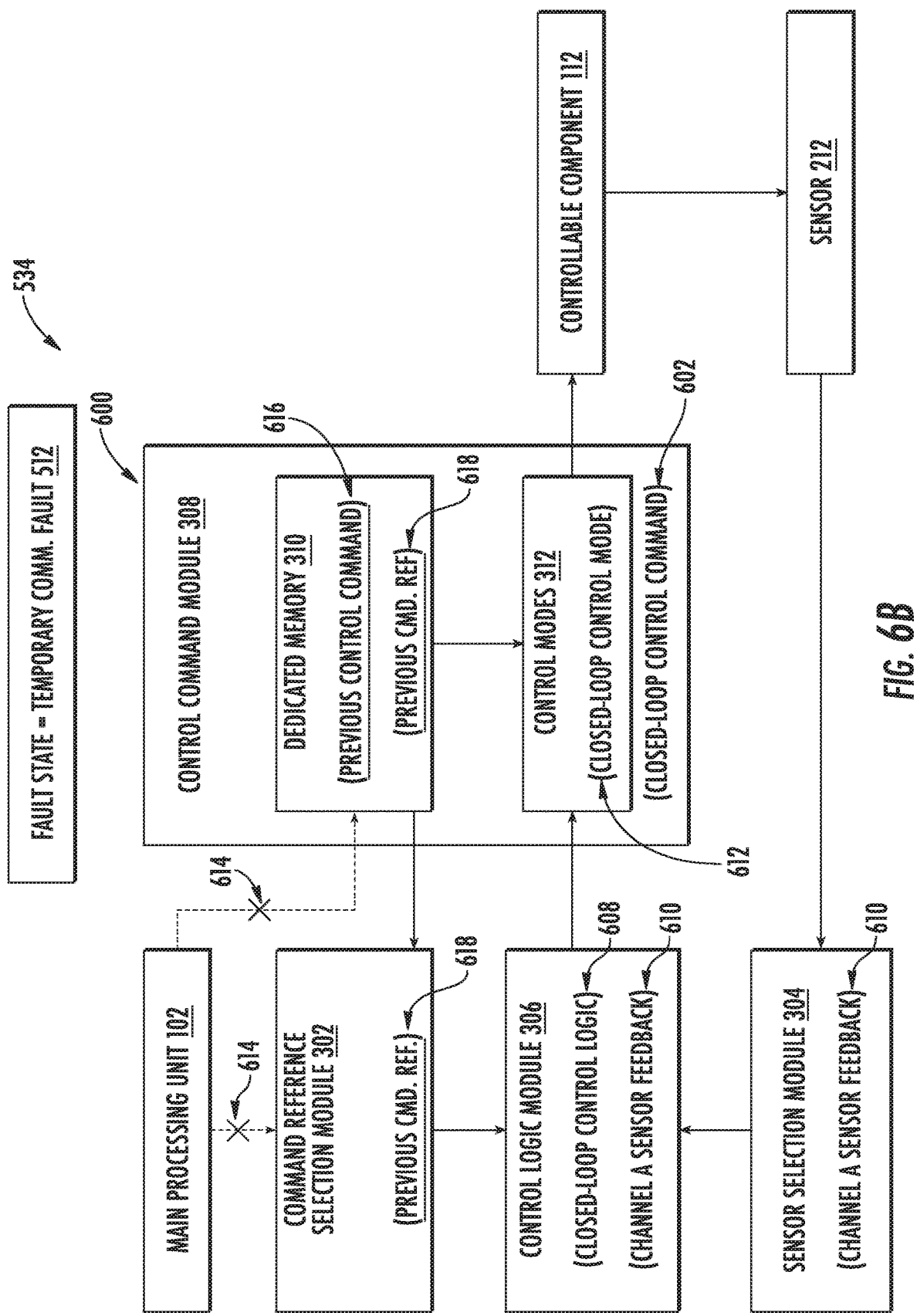

Now referring to FIG. 6B, an exemplary control loop 600 corresponding to a communication fault 510 such as a temporary communication fault 516 will be described. The control loop 600 shown in FIG. 6B reflects an augmented closed-loop control regime 534 with a response state 504 that includes, at block 532 (FIG. 5), using a previous control command from the main processing unit 102 and/or a previous command reference from the main processing unit 102 in closed-loop control. The control loop 600 shown in FIG. 6B provides for an augmented closed-loop control regime 534, generally including similar elements as those described with reference to FIG. 6A. However, as indicated by the fault state 502 including a communication fault 510 such as a temporary communication fault 516, the built-in test module 300 may have determined a fault pertaining to communications between the main processing unit 102 and the distributed control module 104 include a short-term or intermittent communication issue. Such temporary communication fault 516 is indicated in FIG. 6B by an X 614 on the dashed lines between the main processing unit 102 and the control command module 308 and/or between the main processing unit 102 and the command reference selection module 302. The control command module 308 may preserve closed-loop control of the controllable component 112 by providing an augmented closed-loop control regime 534, and as such, the control command module 308 may still output a closed-loop control command 602 notwithstanding the communication fault 510 such as a temporary communication fault 516.

The control command module 308 may include a previous control command 616 and/or a previous command reference 618, which may be stored in dedicated memory 310 of the control command module 308. The previous control command 616 and/or the previous command reference 618 may have been received from the main processing unit 102 at a time prior to the temporary communication fault 516 or during the temporary communication fault 516 but with latency or delay. The control command module 308 may be configured to select the previous control command 616 and/or the previous command reference 618 based at least in part on an indication of the fault state 502 including a temporary communication fault 516, such as based at least in part on such an indication from the built-in test module 300.

The previous command reference 618 may be provided to the command reference selection module 302, for example from the control command module 308. Additionally, or in the alternative, the command reference selection module 302 may be configured to select the previous command reference 618 based at least in part on an indication of the fault state 502 including a communication fault 510 such as a temporary communication fault 516, such as based at least in part on such an indication from the built-in test module 300.

The command reference selection module 302 may provide the previous command reference 618 to the control logic module 306, and the control logic module 306 may also receive sensor feedback (e.g., channel A sensor feedback 610) from a sensor 212 as described with reference to FIG. 6A. The control logic module 306 may be configured to select control logic such as the closed-loop control logic 608 and to process such control logic using such previous command reference 618 as well as the channel A sensor feedback 610 as described with reference to FIG. 6A. For example, the control logic module 306 may be configured to select control logic such as the closed-loop control logic 608 based at least in part on an indication of the fault state 502 including a communication fault 510 such as a temporary communication fault 516, such as based at least in part on such an indication from the built-in test module 300. The control logic module 306 may output the processed control logic to the control command module 308, such as in the form of a control command (e.g., the closed-loop control command 602).

The control command module 308 may be configured to select a control mode 312 such as the closed-loop control mode 612 based at least in part on an indication of the fault state 502 including a communication fault 510 such as a temporary communication fault 516, such as based at least in part on such an indication from the built-in test module 300. The control command module 308 may also be configured to select a control command received from the control logic module 306 such as the closed-loop control command 602 based at least in part on an indication of the fault state 502 including a communication fault 510 such as a temporary communication fault 516, such as based at least in part on such an indication from the built-in test module 300.

The control command module 308 may output the control command, such as the closed-loop control command 602 to the controllable component 112 such that the controllable component 112 may be controlled by such control command (e.g., the closed-loop control command 602), thereby preserving closed-loop control at least in part by providing an augmented closed-loop control regime 534 notwithstanding a communication fault 510 such as the temporary communication fault 516. The sensor 212 may similarly determine a state of the controllable component 112, such as a measured position or value, and may provide sensor feedback, such as channel A sensor feedback 610, to the sensor selection module.

Figure 6C:
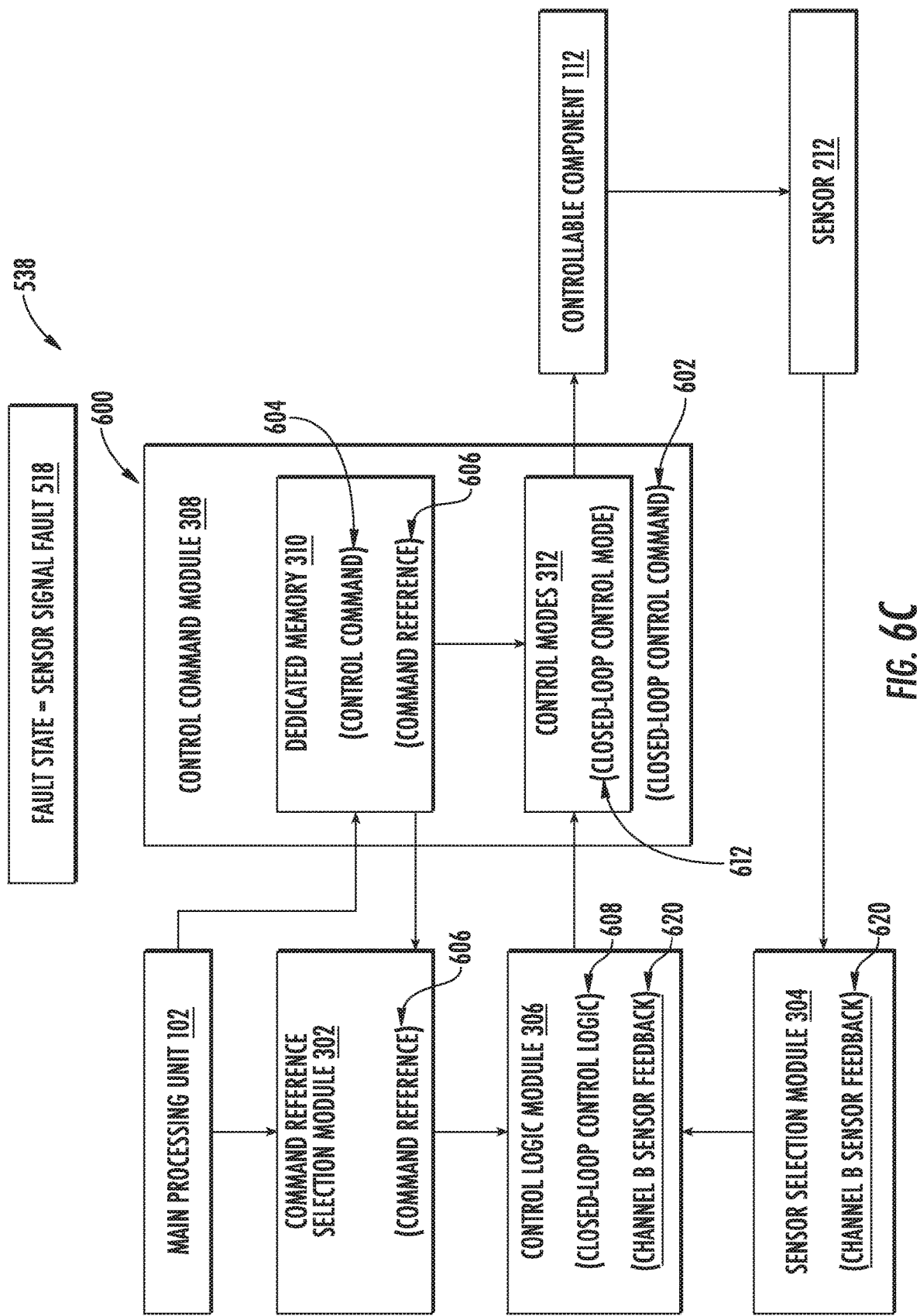

Now referring to FIG. 6C, an exemplary control loop 600 corresponding to a communication fault 510 such as a local sensor fault 518 will be described. The control loop 600 shown in FIG. 6C reflects an augmented closed-loop control regime 538 with a response state 504 that includes, at block 536 (FIG. 5), using a backup sensor channel in closed-loop control. The control loop 600 shown in FIG. 6C provides for augmented closed loop control 538, generally including similar elements as those described with reference to FIG. 6A. However, as indicated by the fault state 502 including a communication fault 510 such as a local sensor fault 518, the built-in test module 300 may have determined a fault pertaining to a particular channel for communications between the sensor 212 and the sensor interface 210, or memory 316 associated with the sensor interface 210 for such channel.

The control command module 308 may preserve closed-loop control of the controllable component 112 by providing an augmented closed-loop control regime 538, and as such, the control command module 308 may still output a closed-loop control command 602 notwithstanding the communication fault 510 such as a temporary communication fault 516.

The sensor selection module 304 may be configured to select a sensor channel for providing sensor feedback from the sensor 212 to the control logic module 306. The sensor channel may be selected based at least in part on an indication of the fault state 502 including a communication fault 510 such as a local sensor fault 518, such as based at least in part on such an indication from the built-in test module 300. As shown, in FIG. 6C, the sensor selection module 304 may utilize channel B sensor feedback 620 received from the sensor 212, and the sensor selection module 304 may provide such channel B sensor feedback 610 to the control logic module 306.

The channel B sensor feedback 620 may be provided to the sensor selection module 304 and/or the sensor selection module 304 may be configured to select the channel B sensor feedback 620 based at least in part on an indication of the fault state 502 including a communication fault 510 such as a local sensor fault 518, such as based at least in part on such an indication from the built-in test module 300.

The control logic module 306 may be configured to select control logic such as the closed-loop control logic 608 and to process such control logic using a command reference 606 as well as the channel B sensor feedback 620 as described with reference to FIG. 6A. For example, the control logic module 306 may be configured to select control logic such as the closed-loop control logic 608 based at least in part on an indication of the fault state 502 including a communication fault 510 such as a local sensor fault 518, such as based at least in part on such an indication from the built-in test module 300. The control logic module 306 may output the processed control logic to the control command module 308, such as in the form of a control command (e.g., the closed-loop control command 602).

The control command module 308 may be configured to select a control mode 312 such as the closed-loop control mode 612 based at least in part on an indication of the fault state 502 including a communication fault 510 such as a local sensor fault 518, such as based at least in part on such an indication from the built-in test module 300. The control command module 308 may also be configured to select a control command received from the control logic module 306 such as the closed-loop control command 602 based at least in part on an indication of the fault state 502 including a communication fault 510 such as a local sensor fault 518, such as based at least in part on such an indication from the built-in test module 300.

The control command module 308 may output the control command, such as the closed-loop control command 602 to the controllable component 112 such that the controllable component 112 may be controlled by such control command (e.g., the closed-loop control command 602), thereby preserving closed-loop control at least in part by providing an augmented closed-loop control regime 538 notwithstanding a communication fault 510 such as the local sensor fault 518. The sensor 212 may similarly determine a state of the controllable component 112, such as a measured position or value, and may provide sensor feedback, such as channel A sensor feedback 610, to the sensor selection module.

Figure 6D:
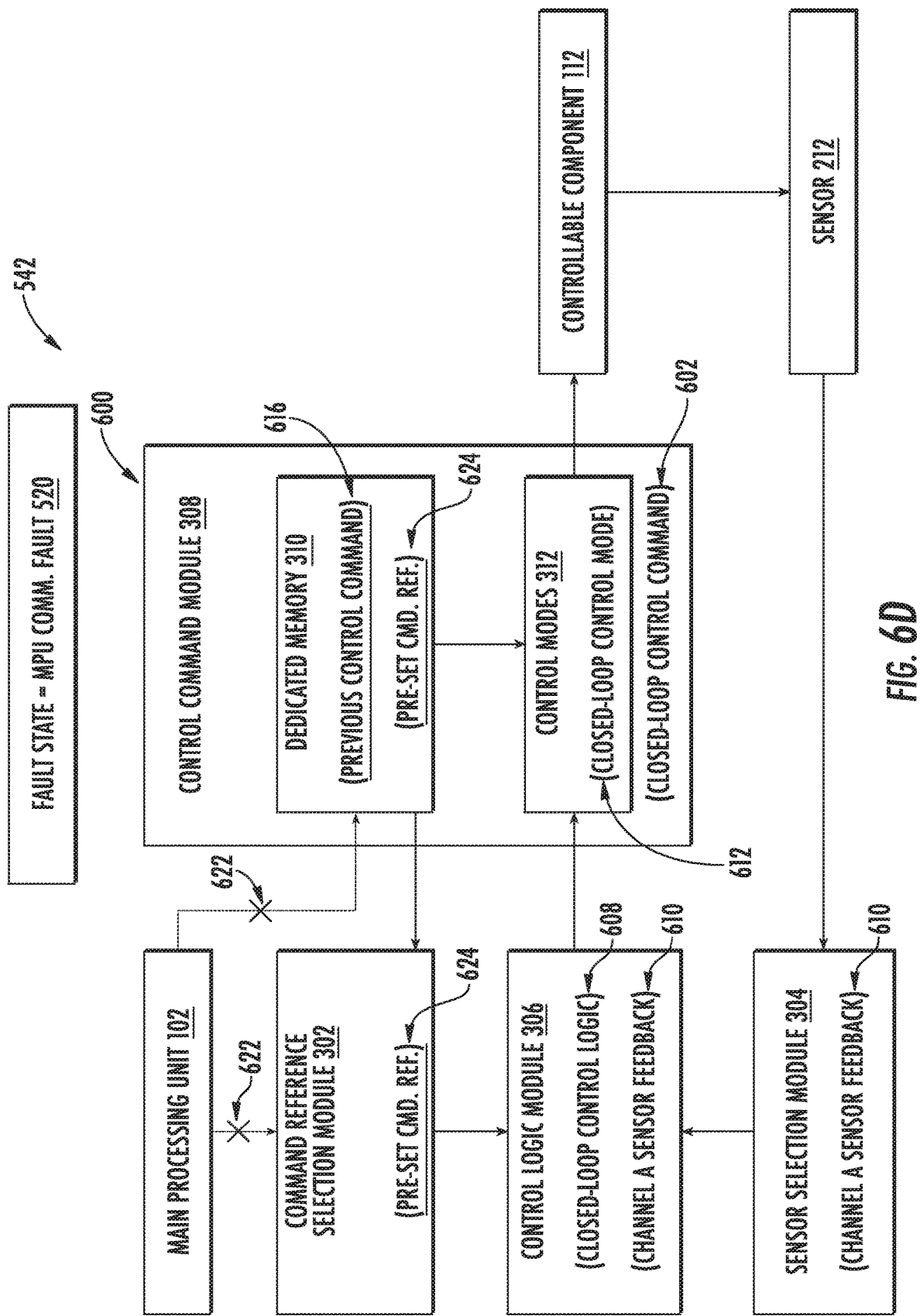

Now referring to FIG. 6D, an exemplary control loop 600 corresponding to a communication fault 510 such as a main processor unit communication fault 520 will be described. The control loop 600 shown in FIG. 6D reflects an augmented closed-loop control regime 542 with a response state 504 that includes, at block 540 (FIG. 5), using a pre-set command reference 624 in closed-loop control. The control loop 600 shown in FIG. 6D provides for augmented closed loop control 542, generally including similar elements as those described with reference to FIG. 6A. However, as indicated by the fault state 502 including a communication fault 510 such as a main processing unit communication fault 520, the built-in test module 300 may have determined a fault pertaining to a long-term or critical communication issue between the main processing unit 102 and the distributed control module 104, such as an outage or failure of the main processing unit 102, or a failure involving the communication interface 204, such as a fault pertaining to memory 316 associated with the communication interface 204. Such main processing unit communication fault 520 is indicated in FIG. 6D by an X 622 on the dashed lines between the main processing unit 102 and the control command module 308 and/or between the main processing unit 102 and the command reference selection module 302.

The control command module 308 may preserve closed-loop control of the controllable component 112 by providing an augmented closed-loop control regime 542, and as such, the control command module 308 may still output a closed-loop control command 602 notwithstanding the communication fault 510 such as a main processing unit communication fault 520.

The control command module 308 may include a previous control command 616 and/or a pre-set command reference 624, which may be stored in dedicated memory 310 of the control command module 308. The previous control command 616 and/or the pre-set command reference 624 may have been received from the main processing unit 102 at a time prior to the temporary communication fault 516 or during the temporary communication fault 516 but with latency or delay. The control command module 308 may be configured to select the previous control command 616 and/or the pre-set command reference 624 based at least in part on an indication of the fault state 502 including a main processing unit communication fault 520, such as based at least in part on such an indication from the built-in test module 300.

The pre-set command reference 624 may be provided to the command reference selection module 302, for example from the control command module 308. Additionally, or in the alternative, the command reference selection module 302 may be configured to select the pre-set command reference 624 based at least in part on an indication of the fault state 502 including a communication fault 510 such as a main processing unit communication fault 520, such as based at least in part on such an indication from the built-in test module 300.

The command reference selection module 302 may provide the pre-set command reference 624 to the control logic module 306, and the control logic module 306 may also receive sensor feedback (e.g., channel A sensor feedback 610) from a sensor 212 as described with reference to FIG. 6A. The control logic module 306 may be configured to select control logic such as the closed-loop control logic 608 and to process such control logic using such previous command reference 618 as well as the channel A sensor feedback 610 as described with reference to FIG. 6A. For example, the control logic module 306 may be configured to select control logic such as the closed-loop control logic 608 based at least in part on an indication of the fault state 502 including a communication fault 510 such as a main processing unit communication fault 520, such as based at least in part on such an indication from the built-in test module 300. The control logic module 306 may output the processed control logic to the control command module 308, such as in the form of a control command (e.g., the closed-loop control command 602).

The control command module 308 may be configured to select a control mode 312 such as the closed-loop control mode 612 based at least in part on an indication of the fault state 502 including a communication fault 510 such as a main processing unit communication fault 520, such as based at least in part on such an indication from the built-in test module 300. The control command module 308 may also be configured to select a control command received from the control logic module 306 such as the closed-loop control command 602 based at least in part on an indication of the fault state 502 including a communication fault 510 such as a main processing unit communication fault 520, such as based at least in part on such an indication from the built-in test module 300.

The control command module 308 may output the control command, such as the closed-loop control command 602 to the controllable component 112 such that the controllable component 112 may be controlled by such control command (e.g., the closed-loop control command 602), thereby preserving closed-loop control at least in part by providing an augmented closed-loop control regime 534 notwithstanding a communication fault 510 such as the main processing unit communication fault 520. The sensor 212 may similarly determine a state of the controllable component 112, such as a measured position or value, and may provide sensor feedback, such as channel A sensor feedback 610, to the sensor selection module.

Figure 6E:
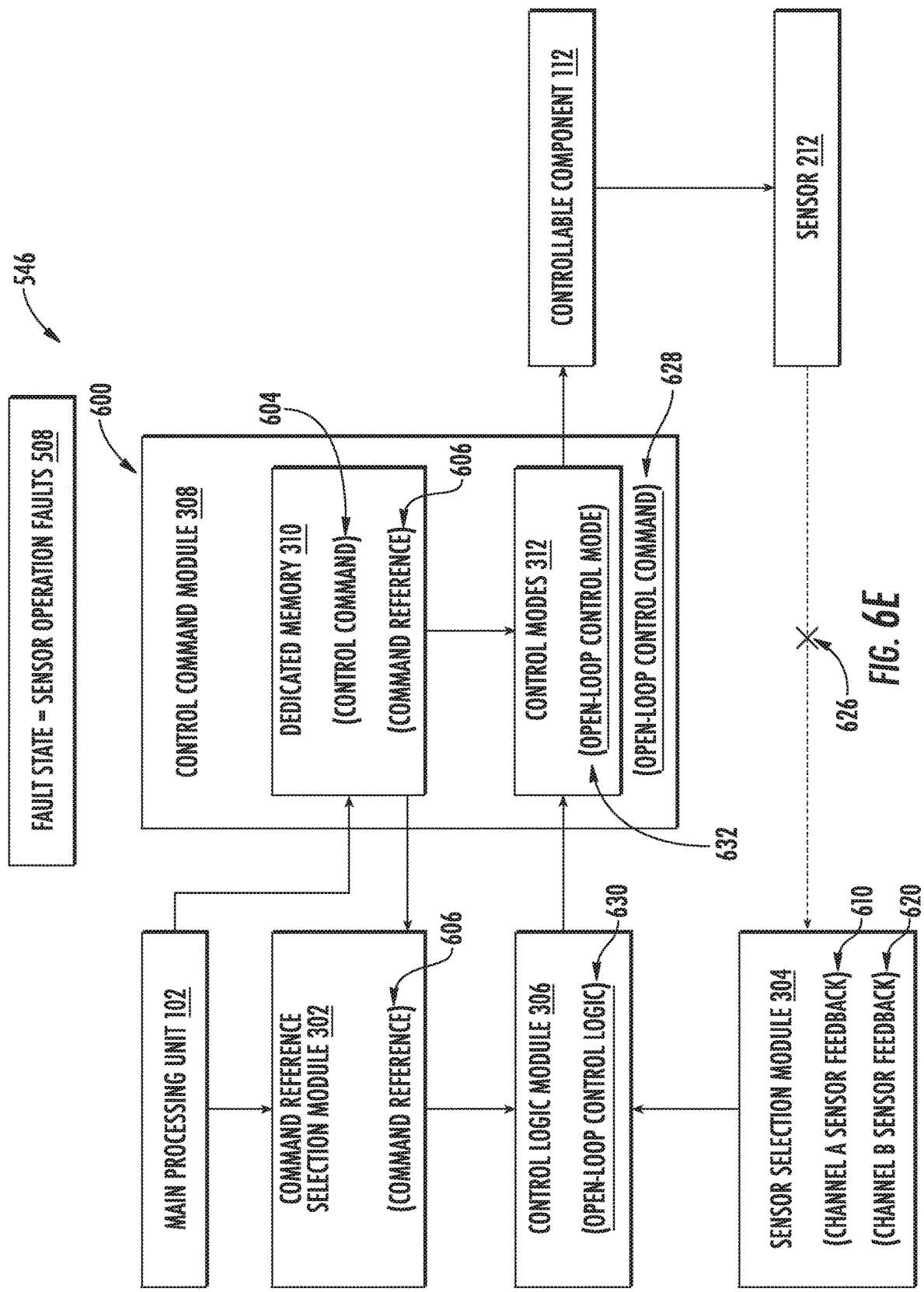

Now referring to FIG. 6E, an exemplary control loop 600 corresponding to a sensor operation fault 512 will be described. The control loop 600 shown in FIG. 6E reflects an open-loop control regime 546 with a response state 504 that includes, at block 544 (FIG. 5), using open-loop control. The control loop 600 shown in FIG. 6E provides for an open-loop control regime 546, generally including similar elements as those described with reference to FIG. 6A, with the exception of lacking sensor feedback (e.g., neither channel A sensor feedback 610 nor channel B sensor feedback 620) from the sensor 212. As indicated by the fault state 502 including a sensor operation fault 512, the built-in test module 300 may have determined a fault associated with the operation of a sensor 212, including an outage or failure of the sensor 212, such as a short circuit, an over-current, or a position error. Such sensor operation fault 512 is indicated in FIG. 6E by an X 626 on the dashed lines between the sensor 212 and the sensor selection module 304.

The control command module 308 may provide open-loop control of the controllable component 112 by providing an open-loop control regime 546, and as such, the control command module 308 may still output a control command (e.g., an open-loop control command 628) notwithstanding the sensor operation fault 512. In this way, even though the distributed control module 104 (e.g., the control command module 308) may provide a closed-loop control regime 530 that requires sensor feedback (e.g., channel A sensor feedback 610 nor channel B sensor feedback 620) from the sensor 212 under a nominal closed-loop control response state 528, the controllable component 112 may nevertheless be controlled using open-loop control in the event of a sensor operation fault 512.

The control command module 308 may include a control command 604 and/or a command reference 606, which may be stored in dedicated memory 310 of the control command module 308. The control command 604 and/or the command reference 606 may have been received from the main processing unit 102. Additionally, or in the alternative, the control command module 308 may be configured to select the control command 604 and/or the command reference 606 based at least in part on an indication of the fault state 502 including a sensor operation fault 512, such as based at least in part on such an indication from the built-in test module 300.

The command reference 606 may be provided to the command reference selection module 302, for example from the control command module 308. Additionally, or in the alternative, the command reference selection module 302 may be configured to select the command reference 606 based at least in part on an indication of the fault state 502 including a sensor operation fault 512, such as based at least in part on such an indication from the built-in test module 300.

The command reference selection module 302 may provide the command reference 606 to the control logic module 306. However, the control logic module 306 may not receive sensor feedback (e.g., neither channel A sensor feedback 610 nor channel B sensor feedback 620) from the sensor 212 as described with reference to FIG. 6A at least in part because of the sensor operation fault 512.

The control logic module 306 may include other control logic, such as open-loop control logic 630, among even others. The control logic module 306 may be configured to select control logic such as the open-loop control logic 630 and to process such control logic using such command reference 606, for example, based at least in part on an indication of the fault state 502 including a sensor operation fault 512, such as based at least in part on such an indication from the built-in test module 300. The control logic module 306 may output the processed control logic to the control command module 308, such as in the form of a control command (e.g., the open-loop control command 628).

The control command module 308 may include a plurality of control modes 312, including an open-loop control mode 632. The control command module 308 may be configured to select a control mode 312 such as the open-loop control mode 632 based at least in part on an indication of the fault state 502 including a sensor operation fault 512, such as based at least in part on such an indication from the built-in test module 300. The control command module 308 may also be configured to select a control command received from the control logic module 306 such as the open-loop control command 628 based at least in part on an indication of the fault state 502 including a sensor operation fault 512, such as based at least in part on such an indication from the built-in test module 300.

The control command module 308 may output the control command, such as the open-loop control command 628 to the controllable component 112 such that the controllable component 112 may be controlled by such control command (e.g., the open-loop control command 628), thereby providing open-loop control in the event of a sensor operation fault 512 pertaining to a sensor 212 used in a closed-loop control regime 530.

Figure 6F:
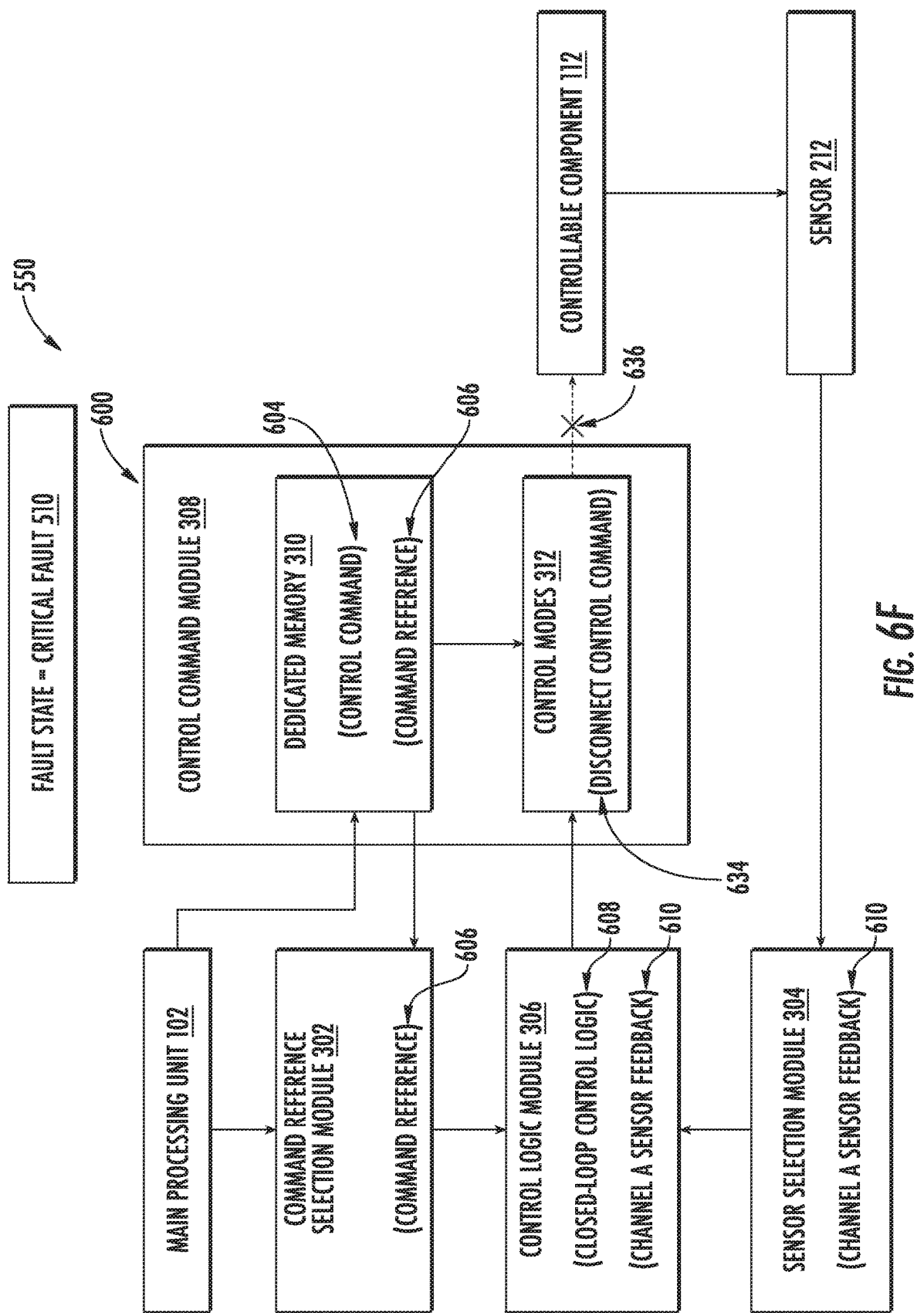

Now referring to FIG. 6F, an exemplary control loop 600 corresponding to a critical fault 514 will be described. The control loop 600 shown in FIG. 6F reflects a disconnected control regime 550 with a response state 504 that includes, at block 548 (FIG. 5), disconnecting the controller 200 or the distributed control module 104 from the controllable component 112. The control loop 600 shown in FIG. 6F provides for a disconnect control command 634, which may be executed physically, such as via a physical switch, and/or logically or virtually via instructions 318 executed by a processor 314 associated with the controller 200. As indicated by the fault state 502 including a critical fault 514, the built-in test module 300 may have determined a processor fault 522, a memory fault 524, and/or a controllable component fault 526. The disconnected control regime 550 is indicated in FIG. 6F by an X 636 on the dashed lines between the control command module 308 and the sensor 212.

In some embodiments, the distributed control module 104 (e.g., the control command module 308) may disconnect control (e.g., both closed-loop control and open-loop control) of the controllable component 112 only in the event of a critical fault 514, while preserving control of the controlllable component 112 through one or more control regimes (e.g., closed-loop control regime 530, an augmented closed-loop control regime 534, 538, 542, and/or an open-loop control regime 546) in the event of fault states 502 that do not include a critical fault 514.

In various embodiments, the presently disclosed fault states 502, response states 504, and/or control regimes 506 may be included individually or in combination. For example, more than one fault state 502 may existing at the same time. Generally, in the event of more than one fault state 502, the corresponding response state 504 and/or the corresponding control regime 506 may include an aggregate of the response states 504 and/or control regimes 506 corresponding to the more than one fault state 502. However, one response state 504 and one corresponding control regime 506 may be provided in the event of more than one fault state 502.

For example, in the event of a temporary communication fault 516 concurrently with a local sensor fault 518, an aggregate response state 504 may include both, at block 532, using a previous control command 616 and/or a previous command reference 618 from the main processing unit 102 in closed-loop control, as well as, at block 536, using a backup sensor channel in closed-loop control. A corresponding control regime 506 to such aggregate response state 504 may include an aggregate augmented closed-loop control regime including the augmented closed-loop control regime 534 shown in FIG. 6B and the augmented closed-loop control regime 538 shown in FIG. 6C.

As another example, in the event of a sensor operation fault 512 concurrently with a communication fault 510, a response state may include using open loop control 544 in an open-loop control regime 546 such as shown in FIG. 6E.

As yet another example, in the event of a critical fault 514 concurrently a sensor operation fault 512 and/or a communication fault 510, a response state 504 may include, at block 548, disconnecting the controller 200 or the distributed control module 104 from the controllable component 112.

Figure 7:
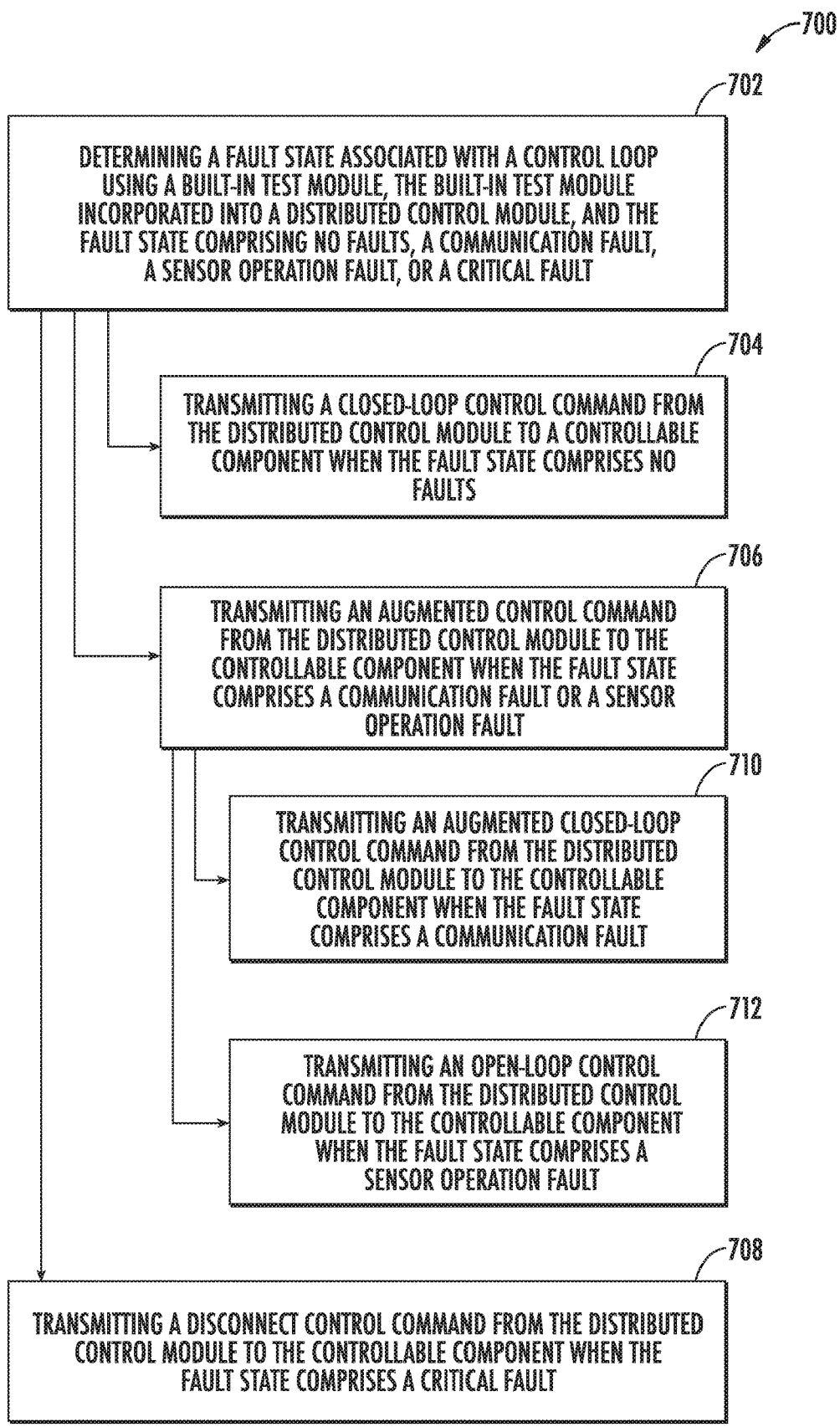
FIG. 7 shows a block diagram depicting an exemplary method of responding to fault states.

Now turning to FIG. 7, exemplary methods of responding to fault states 502 associated with a distributed control module 104 will be discussed. As shown, an exemplary method 700 may include, at block 702, determining a fault state 502 associated with a control loop using a built-in test module 300. The built-in test module 300 may be incorporated into a distributed control module 104, and the fault state 502 may include no faults 508, a communication fault 510, a sensor operation fault 512, or a critical fault 514. The exemplary method 700 may additionally include, at block 704, transmitting a closed-loop control command 602 from the distributed control module 104 to a controllable component 112 when the fault state 502 comprises no faults 508. The exemplary method 700 may additionally or alternatively include, at block 706, transmitting an augmented control command (e.g., a closed-loop control command 602 in an augmented closed-loop control regime 534, 538, 542, or an open-loop control command 628 in an open-loop control regime 546) from the distributed control module 104 to the controllable component 112 when the fault state 502 includes a communication fault 510 or a sensor operation fault 512. The exemplary method 700 may further additionally or alternatively include, at block 708, transmitting a disconnect control command 634 from the distributed control module 104 to the controllable component 112 when the fault state 502 includes a critical fault 514.

In some embodiments, an exemplary method 700 may include, at block 710, transmitting an augmented closed-loop control command 602 (e.g., in an augmented closed-loop control regime 534, 538, 542) from the distributed control module 104 to the controllable component 112 when the fault state 502 includes a communication fault 510. Additionally, or in the alternative, an exemplary method 700 may include, at block 712, transmitting an open-loop control command 628 (e.g., in an open-loop control regime 546) from the distributed control module 104 to the controllable component 112 when the fault state 502 includes a sensor operation fault 512.

Aspects of the presently disclosure may be incorporated into, or otherwise utilized with, any process, system, or machine where a distributed control system 100 and/or distributed control module 104 may be desirable. By way of example, the present disclosure may be implemented with a turbomachine, such as a turbofan engine 800. FIG. 8 provides a schematic, cross-sectional view of a turbofan engine 800 in accordance with an exemplary embodiment of the present disclosure. The engine 800 may be incorporated into a vehicle, such as an aircraft, a marine vessel, or a land vehicle. For example, the engine 800 may be an aeronautical engine incorporated into an aircraft. Alternatively, however, the engine may be any other suitable type of engine for any other suitable vehicle.

For the embodiment depicted, the engine is configured as a high bypass turbofan engine 800. As shown in FIG. 8, the turbofan engine 800 defines an axial direction A (extending parallel to a longitudinal centerline 801 provided for reference), a radial direction R, and a circumferential direction (extending about the axial direction A; not depicted in FIG. 8). In general, the turbofan 800 includes a fan section 802 and a turbomachine 804 disposed downstream from the fan section 802.

The exemplary turbomachine 804 depicted generally includes a substantially tubular outer casing 806 that defines an annular inlet 808. The outer casing 806 encases, in serial flow relationship, a compressor section including a booster or low pressure (LP) compressor 810 and a high pressure (HP) compressor 812; a combustion section 814; a turbine section including a high pressure (HP) turbine 816 and a low pressure (LP) turbine 818; and a jet exhaust nozzle section 820. The compressor section, combustion section 814, and turbine section together define at least in part a core air flowpath 821 extending from the annular inlet 808 to the jet nozzle exhaust section 820. The turbofan engine further includes one or more drive shafts. More specifically, the turbofan engine includes a high pressure (HP) shaft or spool 822 drivingly connecting the HP turbine 816 to the HP compressor 812, and a low pressure (LP) shaft or spool 824 drivingly connecting the LP turbine 818 to the LP compressor 810.

For the embodiment depicted, the fan section 802 includes a fan 826 having a plurality of fan blades 828 coupled to a disk 830 in a spaced apart manner. The fan blades 828 and disk 830 are together rotatable about the longitudinal axis 801 by the LP shaft 824. The disk 830 is covered by rotatable front hub 832 aerodynamically contoured to promote an airflow through the plurality of fan blades 828. Further, an annular fan casing or outer nacelle 834 is provided, circumferentially surrounding the fan 826 and/or at least a portion of the turbomachine 804. The nacelle 834 is supported relative to the turbomachine 804 by a plurality of circumferentially-spaced outlet guide vanes 836. A downstream section 838 of the nacelle 834 extends over an outer portion of the turbomachine 804 so as to define a bypass airflow passage 840 therebetween.

Referring still to FIG. 8, the turbofan engine 800 additionally includes a fuel delivery system 842. The fuel delivery system 842 generally includes a fuel source 844, such as a fuel tank, and one or more fuel lines 846. The one or more fuel lines 846 provide a fuel flow through the fuel delivery system 842 to the combustion section 814 of the turbomachine 804 of the turbofan engine 800. The fuel delivery system may include one or more controllable components 112, such as a fuel valve or an actuator or servo-actuator coupled to a fuel valve. One or more sensors 212 may be operable coupled, respectively, to the one or more controllable components 112. The one or more controllable components 112 may be controlled using a distributed control module 104, which may be communicatively coupled to a distributed control system 100. The one or more sensors 212 may be communicatively coupled to the distributed control module 104, for example, so as to provide a closed-loop control regime 530 or an augmented closed-loop control regime 534, 538, 542.

It will be appreciated that the exemplary turbofan engine 800 depicted in FIG. 8 is provided by way of example only. In other exemplary embodiments, any other suitable engine may be utilized with aspects of the present disclosure. For example, in other embodiments, the engine may be any other suitable gas turbine engine, such as a turboshaft engine, turboprop engine, turbojet engine, etc. In such a manner, it will further be appreciated that in other embodiments the gas turbine engine may have any other suitable configuration, such as any other suitable number or arrangement of shafts, compressors, turbines, fans, etc. Further, still, in alternative embodiments, aspects of the present disclosure may be incorporated into, or otherwise utilized with, any other suitable type of gas turbine engine, such as an industrial gas turbine engine incorporated into a power generation system, a nautical gas turbine engine, etc. any other type of engine, such as reciprocating engines.

Further, although not depicted herein, in other embodiments an exemplary engine 800 may include any number of distributed control modules 104 configured to control various controllable components 112 of the engine 800, including variable-geometry components include variable-position fan blades, variable-position guide vanes, variable-position compressor blades, and variable-position turbine blades. Such distributed control modules 104 may be part of a single distributed control system 100 or part of a plurality of distributed control systems 100.

This written description uses exemplary embodiments to describe the presently disclosed subject matter, including the best mode, and also to enable any person skilled in the art to practice such subject matter, including making and using any devices or systems and performing any incorporated methods. The patentable scope of the presently disclosed subject matter is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of responding to faults in a control loop having a distributed control module, the method comprising:
   determining a fault state associated with the control loop via a test module built into the distributed control module, the fault state comprising no faults, a communication fault, a sensor operation fault, or a critical fault; and
   transmitting a control command from the distributed control module based on the fault state,
   wherein when the fault state indicates no faults, the transmitting comprises transmitting a closed loop control command from the distributed control module to a controllable component,
   wherein when the fault state indicates a communication fault or a sensor operation fault, the transmitting comprises transmitting an augmented control command from the distributed control module to the controllable component,
   wherein when the fault state indicates a critical fault, the transmitting comprises transmitting a disconnect control command from the distributed control module to the controllable component.

2. The method of claim 1, wherein the augmented control command comprises a closed-loop control command when the fault state comprises a communication fault.

3. The method of claim 1, wherein the augmented control command comprises an open-loop control command when the fault state comprises a sensor operation fault.

4. The method of claim 1, wherein the communication fault comprises a temporary communication fault, a local sensor fault, and or a main processing unit communication fault.

5. The method of claim 1, wherein the critical fault comprises a processor fault, a memory fault, and/or a controllable component fault.

6. The method of claim 1, comprising:
   using a previous control command and/or a previous command reference in an augmented closed-loop control regime when the built-in test module determines a fault state comprising a temporary communication fault, the augmented closed-loop control regime including a control command module configured to transmit the augmented control command.

7. The method of claim 1, comprising:
   using a backup sensor channel in an augmented closed-loop control regime when the built-in test module determines a fault state comprising a local sensor fault, the augmented closed-loop control regime including a control command module configured to transmit the augmented control command.

8. The method of claim 1, comprising:
   using a pre-set command reference and/or a previous control command in an augmented closed-loop control regime when the built-in test module determines a fault state comprising a main processing unit communication fault, the augmented closed-loop control regime including a control command module configured to transmit the augmented control command.

9. The method of claim 1, comprising:
   using an open-loop control command in an open-loop control regime when the built-in test module determines a fault state comprising a sensor operation fault, the open-loop control regime including a control command module configured to transmit the open-loop control command, the augmented control command comprising the open-loop control command.

10. The method of claim 1, comprising:
    receiving sensor feedback from a sensor configured to measure a system variable of the controllable component.

11. The method of claim 1, wherein the controllable component comprises an actuator or a servo-actuator.

12. The method of claim 11, wherein the sensor comprises a position sensor configured to measure a position of the actuator or servo-actuator.

13. A distributed control system comprising:
a main processing unit, a distributed control module, and a controllable component, the distributed control module configured to:
determine a fault state associated with a control loop via a test module built into the distributed control module, the fault state comprising no faults, a communication fault, a sensor operation fault, or a critical fault; and
transmit a control command from the distributed control module based on the fault state,
wherein when the fault state indicates no faults, the control command comprises a closed-loop control command,
wherein when the fault state indicates a communication fault or a sensor operation fault, the control command comprises an augmented control command
wherein when the fault state indicates a critical fault, the control command comprises a disconnect control command.

14. The distributed control system of claim 13, wherein the distributed control module comprises:
a built-in test module, the built-in test module configured to determine the fault state.

15. The distributed control system of claim 13, wherein the controllable component comprises an actuator or servo-actuator coupled to a variable-geometry component.

16. The distributed control system of claim 15, wherein the sensor comprises a position sensor configured to measure a position of the actuator or servo-actuator.

17. The distributed control system of claim 15, wherein the variable-geometry component comprises a fuel valve, a variable-position fan blade, a variable-position guide vane, a variable-position compressor blade, or a variable-position turbine blade.

18. A non-transitory computer readable medium comprising computer-executable instructions, which, when executed by one or more processors of distributed control module, cause the distributed control module to:
determine a fault state associated with the control loop via a test module built into the distributed control module, the fault state comprising no faults, a communication fault, a sensor operation fault or a critical fault; and
transmit a control command from the distributed control module the fault state,
wherein when the fault state indicates no faults, the control command comprises a closed- loop control command,
wherein when the fault state indicates a communication fault or a sensor operation fault, the control command comprises an augmented control command
wherein when the fault state indicates a critical fault, the control command comprises a disconnect control command.

19. The non-transitory computer readable medium of claim 18, wherein the computer readable medium is incorporated into or utilized with a full authority direct engine control (FADEC) system or an engine control unit (ECU) for a turbomachine and/or an aircraft.

20. A distributed control system comprising:
a distributed control module; and
a test module built into the distributed control module for enabling reconfiguration of only the control module,
wherein the distributed control module is configured to:
determine a fault state associated with a control loop via the test module, the fault state comprising no faults, a communication fault, a sensor operation fault, or a critical fault; and
transmit a control command from the distributed control module based on the fault state,
wherein when the fault state indicates no faults, the control command comprises a closed- loop control command,
wherein when the fault state indicates a communication fault or a sensor operation fault, the control command comprises an augmented control command,
wherein when the fault state indicates a critical fault, the control command comprises a disconnect control command.

* * * * *